(12) United States Patent
Lin et al.

(10) Patent No.: US 12,261,213 B2
(45) Date of Patent: Mar. 25, 2025

(54) FIN-END GATE STRUCTURES AND METHOD FORMING SAME

(71) Applicant: Taiwan Semiconductor Manufacturing Co., Ltd., Hsinchu (TW)

(72) Inventors: Shih-Yao Lin, New Taipei (TW); Kuei-Yu Kao, Hsinchu (TW); Chen-Ping Chen, Toucheng Township (TW); Chih-Han Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 37 days.

(21) Appl. No.: 17/814,779

(22) Filed: Jul. 25, 2022

(65) Prior Publication Data

US 2022/0359722 A1    Nov. 10, 2022

Related U.S. Application Data

(62) Division of application No. 16/870,429, filed on May 8, 2020, now Pat. No. 11,532,723.

(Continued)

(51) Int. Cl.
*H01L 29/78* (2006.01)
*H01L 21/027* (2006.01)
(Continued)

(52) U.S. Cl.
CPC .... *H01L 29/66545* (2013.01); *H01L 21/0273* (2013.01); *H01L 21/31144* (2013.01); *H01L 21/76224* (2013.01); *H01L 21/823418* (2013.01); *H01L 21/823431* (2013.01); *H01L 21/823456* (2013.01);
(Continued)

(58) Field of Classification Search
None
See application file for complete search history.

(56) References Cited

U.S. PATENT DOCUMENTS 9,490,177 B2    11/2016    Oh et al.
9,721,950 B2    8/2017    You et al.
(Continued)

FOREIGN PATENT DOCUMENTS

CN    107644815 A    1/2018
JP    2013229597 A    11/2013
(Continued)

*Primary Examiner* — Joseph C. Nicely
*Assistant Examiner* — Lamont B Koo
(74) *Attorney, Agent, or Firm* — Slater Matsil, LLP

(57) ABSTRACT

A method includes simultaneously forming a first dummy gate stack and a second dummy gate stack on a first portion and a second portion of a protruding fin, simultaneously removing a first gate electrode of the first dummy gate stack and a second gate electrode of the second dummy gate stack to form a first trench and a second trench, respectively, forming an etching mask, wherein the etching mask fills the first trench and the second trench, patterning the etching mask to remove the etching mask from the first trench, removing a first dummy gate dielectric of the first dummy gate stack, with the etching mask protecting a second dummy gate dielectric of the second dummy gate stack from being removed, and forming a first replacement gate stack and a second replacement gate stack in the first trench and the second trench, respectively.

20 Claims, 30 Drawing Sheets

Related U.S. Application Data

(60) Provisional application No. 62/927,567, filed on Oct. 29, 2019.

(51) Int. Cl.
*H01L 21/311* (2006.01)
*H01L 21/762* (2006.01)
*H01L 21/8234* (2006.01)
*H01L 27/088* (2006.01)
*H01L 29/06* (2006.01)
*H01L 29/10* (2006.01)
*H01L 29/423* (2006.01)
*H01L 29/51* (2006.01)
*H01L 29/66* (2006.01)

(52) U.S. Cl.
CPC ........ *H01L 21/823462* (2013.01); *H01L 21/823481* (2013.01); *H01L 27/0886* (2013.01); *H01L 29/0673* (2013.01); *H01L 29/1037* (2013.01); *H01L 29/42364* (2013.01); *H01L 29/42376* (2013.01); *H01L 29/42392* (2013.01); *H01L 29/513* (2013.01); *H01L 29/66795* (2013.01); *H01L 29/7851* (2013.01); *H01L 29/66553* (2013.01); *H01L 29/6656* (2013.01)

(56) References Cited

U.S. PATENT DOCUMENTS

| | | | |
|---|---|---|---|
| 9,755,079 | B2 | 9/2017 | Park et al. |
| 10,032,886 | B2 | 7/2018 | Chung et al. |
| 10,319,832 | B2 | 6/2019 | Li et al. |
| 10,991,692 | B2 | 4/2021 | Kang et al. |
| 2014/0001575 | A1 | 1/2014 | Adams et al. |
| 2016/0181428 | A1 | 6/2016 | Chen et al. |
| 2018/0145143 | A1 | 5/2018 | Chen et al. |

FOREIGN PATENT DOCUMENTS

| | | |
|---|---|---|
| KR | 20160102788 A | 8/2016 |
| KR | 20160132525 A | 11/2016 |
| KR | 20170000539 A | 1/2017 |
| KR | 20180112372 A | 10/2018 |

FIN-END GATE STRUCTURES AND METHOD FORMING SAME

PRIORITY CLAIM AND CROSS-REFERENCE

This application is a divisional of U.S. patent application Ser. No. 16/870,429, entitled "Fin-End Gate Structures and Method Forming Same," and filed May 8, 2020, which claims the benefit of U.S. Provisional Application No. 62/927,567, entitled "Method for 3D Channel Device Yield Improvement and Resulting Structure," and filed on Oct. 29, 2019, which applications are hereby incorporated herein by reference.

BACKGROUND

Metal-Oxide-Semiconductor (MOS) devices are basic building elements in integrated circuits. A MOS device may have a gate electrode formed of polysilicon doped with p-type or n-type impurities, which are doped using doping processes such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves forming a dummy gate stack, removing the dummy gate stack to form a trench, forming a replacement gate stacks including a metal gate extending into the trench, and then performing a Chemical Mechanical Polish (CMP) process to remove excess portions of the metal gate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
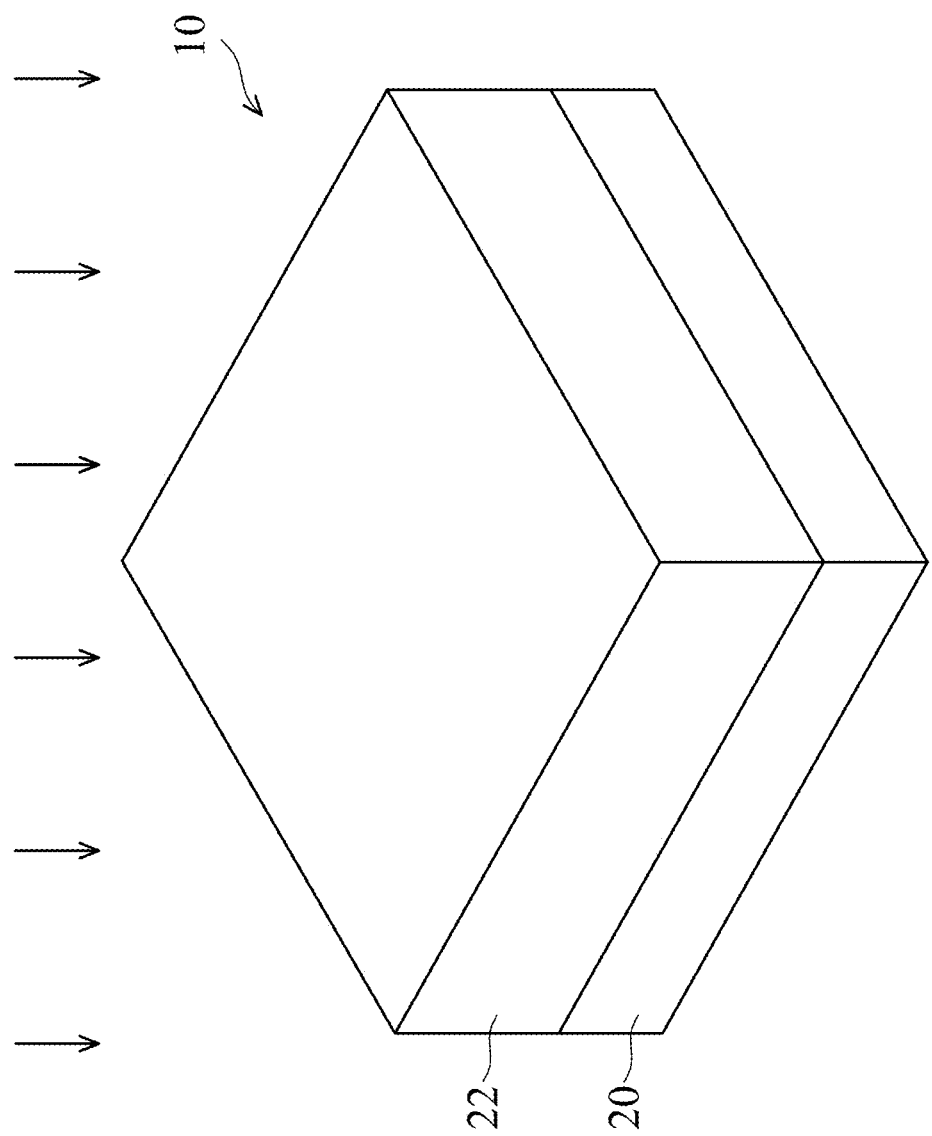
FIGS. 1-3, 4A, 4B, 5A, 5B, 6A, 6B, 7A, 7B, 8A, 8B, 8C, and 9-13 illustrate the perspective views, top views, and cross-sectional views of intermediate stages in the formation of Fin Field-Effect Transistors (FinFETs) and fin-end gate structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming Fin Field-Effect Transistors (FinFETs), Gate-All-Around (GAA) transistors, and fin-end gate structures and the resulting structures are provided in accordance with some embodiments. The intermediate stages of forming the transistors are illustrated in accordance with some embodiments. Some variations of some embodiments are discussed. Throughout the various views and illustrative embodiments, like reference numbers are used to designate like elements. The formation of transistors such as Carbon-Network-Tube (CNT), Multi Bridge Channel FET (MBCFET), Nanosheet FET (NSFET), nanostructure transistor; Complementary (CFET), Vertical FET (VFET), etc. and the corresponding fin-end gate structures can also adopt the embodiments of the present disclosure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed as being performed in a particular order, other method embodiments may be performed in any logical order.

In accordance with some embodiments of the present disclosure, a first dummy gate stack and a second dummy gate stack, which may include dummy gate electrodes, are formed on an intermediate portion and an end portion, respectively, of a protruding fin. The protruding fin may be a protruding semiconductor fin or may include stacked layers (including semiconductor layers and sacrificial layers, for example). The first and the second dummy gate electrodes of the first and the second gate stacks are removed, exposing the underlying first dummy gate dielectric and second dummy gate dielectric, respectively. The first dummy gate dielectric covering the intermediate portion of the protruding fin is removed, while the second dummy gate dielectric covering the end portion of the protruding fin is left unremoved. By leaving the second dummy gate dielectric unremoved, the underlying end portion of the protruding fin is protected from the damage caused by subsequent processes, and the nearest source/drain region adjacent to the end portion of the protruding fin is protected.

FIGS. 1-3, 4A, 4B, 5A, 5B, 6A, 6B, 7A, 7B, 8A, 8B, 8C, and 9-13 illustrate the cross-sectional views and perspective views of intermediate stages in the formation of Fin Field-Effect Transistors (FinFETs) and fin-end gate structures in accordance with some embodiments of the present disclosure. The processes shown in these figures are also reflected schematically in the process flow 400 shown in FIG. 23.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 23:
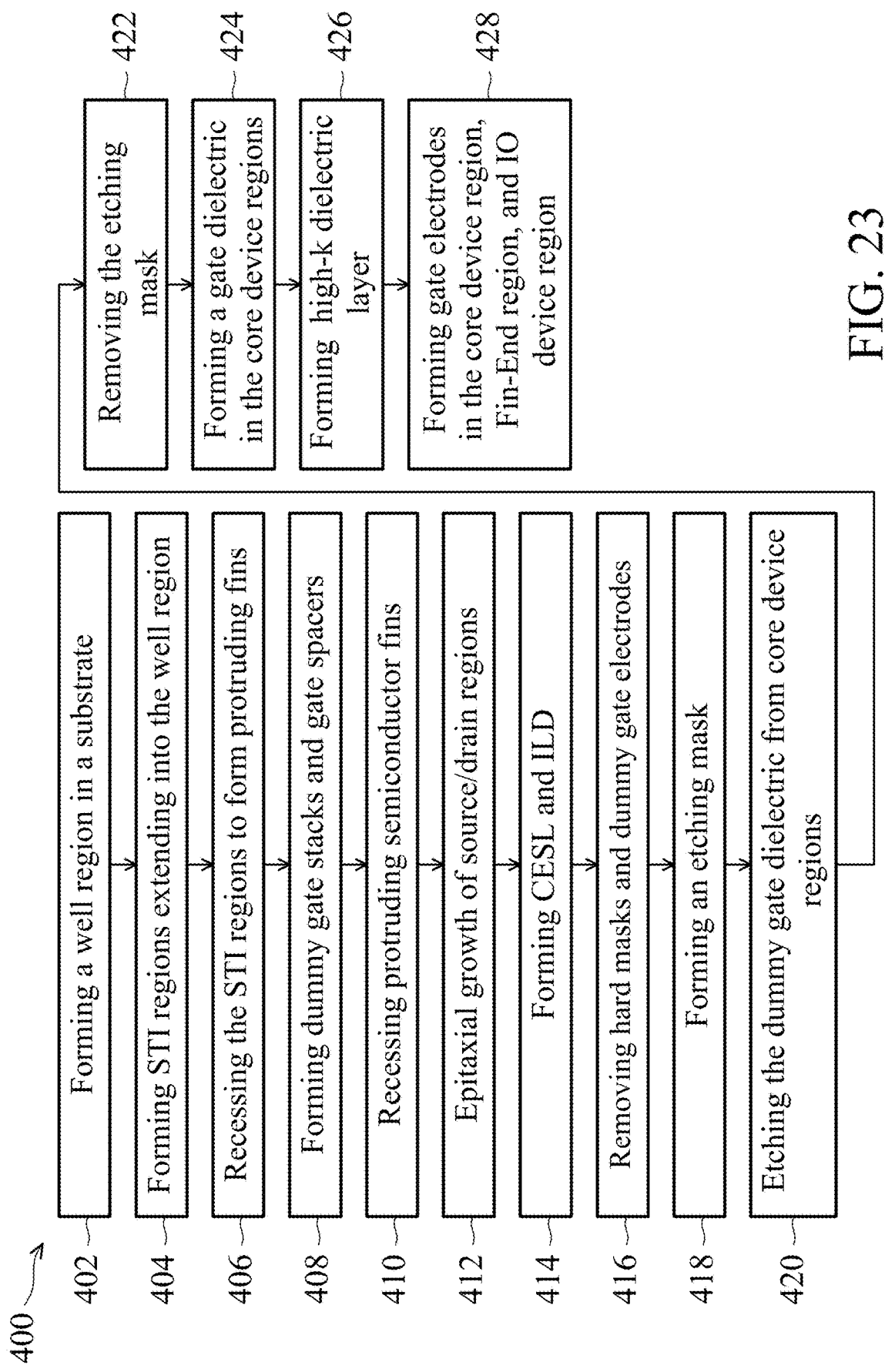
FIG. 23 illustrates a process flow for forming FinFETs and fin-end gate structures in accordance with some embodiments.

Further referring to FIG. 1, well region 22 is formed in substrate 20. The respective process is illustrated as process 402 in the process flow 400 as shown in FIG. 23. In accordance with some embodiments of the present disclosure, well region 22 is a p-type well region formed through implanting a p-type impurity, which may be boron, indium, or the like, into substrate 20. In accordance with other embodiments of the present disclosure, well region 22 is an n-type well region formed through implanting an n-type impurity, which may be phosphorus, arsenic, antimony, or the like, into substrate 20. The resulting well region 22 may extend to the top surface of substrate 20. The n-type or p-type impurity concentration may be equal to or less than $10^{18}$ cm$^{-3}$, such as in the range between about $10^{17}$ cm$^{-3}$ and about $10^{18}$ cm$^{-3}$.

Figure 2:
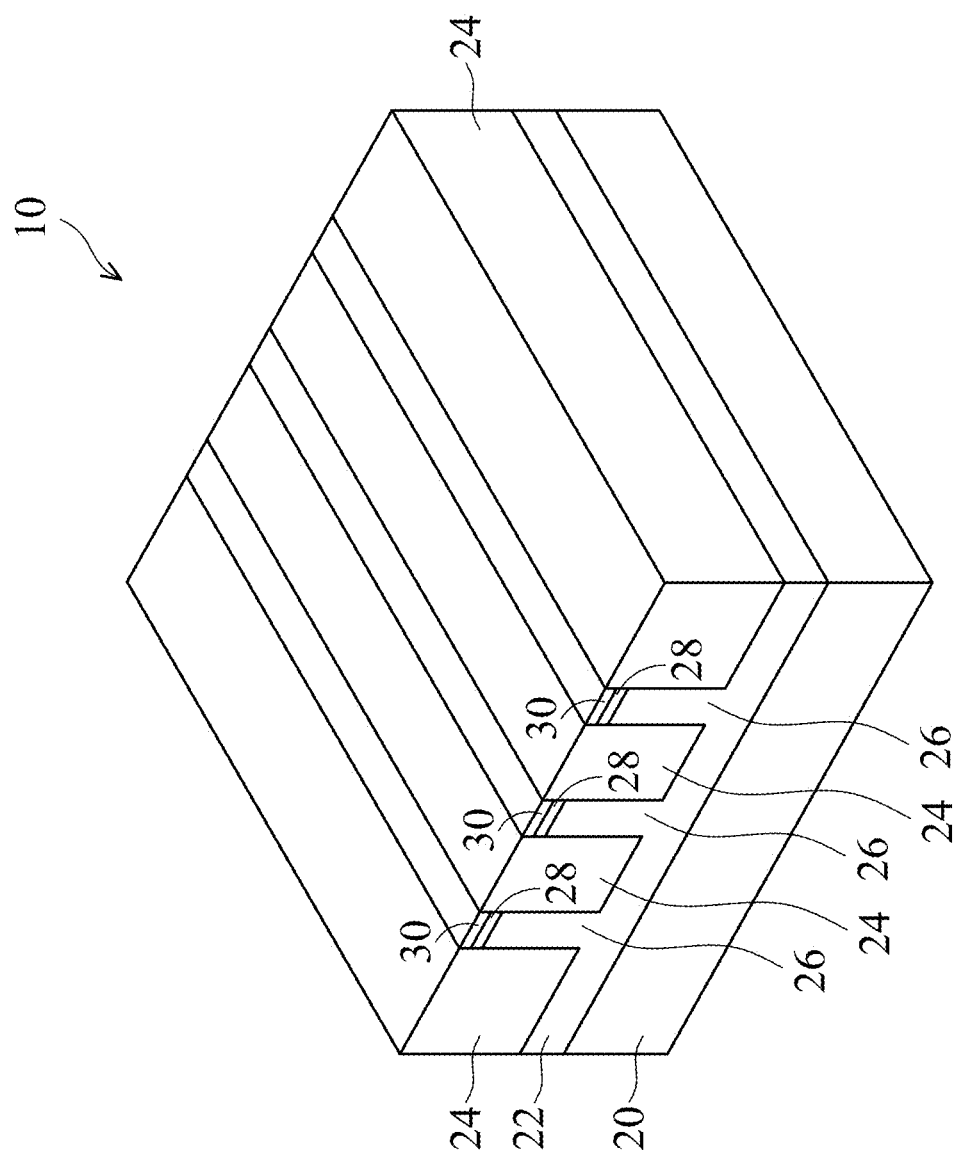

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 404 in the process flow 400 as shown in FIG. 23. The portions of substrate 20 between neighboring STI regions 24 are referred to as semiconductor strips 26. To form STI regions 24, pad oxide layer 28 and hard mask layer 30 may be formed on semiconductor substrate 20, and are then patterned. Pad oxide layer 28 may be a thin film formed of silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitriding of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through the thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), Chemical Vapor Deposition (CVD), or the like. STI regions 24 also include a dielectric material over the liner dielectric, wherein the dielectric material may be formed using Flowable Chemical Vapor Deposition (FCVD), spin-on coating, or the like. The dielectric material over the liner dielectric may include silicon oxide in accordance with some embodiments.

The top surfaces of hard mask layers 30 and the top surfaces of STI regions 24 may be substantially level with each other. Semiconductor strips 26 are between neighboring STI regions 24. In accordance with some embodiments of the present disclosure, semiconductor strips 26 are parts of the original substrate 20, and hence the material of semiconductor strips 26 is the same as that of substrate 20. In accordance with alternative embodiments of the present disclosure, semiconductor strips 26 are replacement strips formed by etching the portions of substrate 20 between STI regions 24 to form recesses, and performing an epitaxy to regrow another semiconductor material in the recesses. Accordingly, semiconductor strips 26 are formed of a semiconductor material different from that of substrate 20. In accordance with some embodiments, semiconductor strips 26 are formed of silicon germanium, silicon carbon, or a III-V compound semiconductor material.

Figure 3:
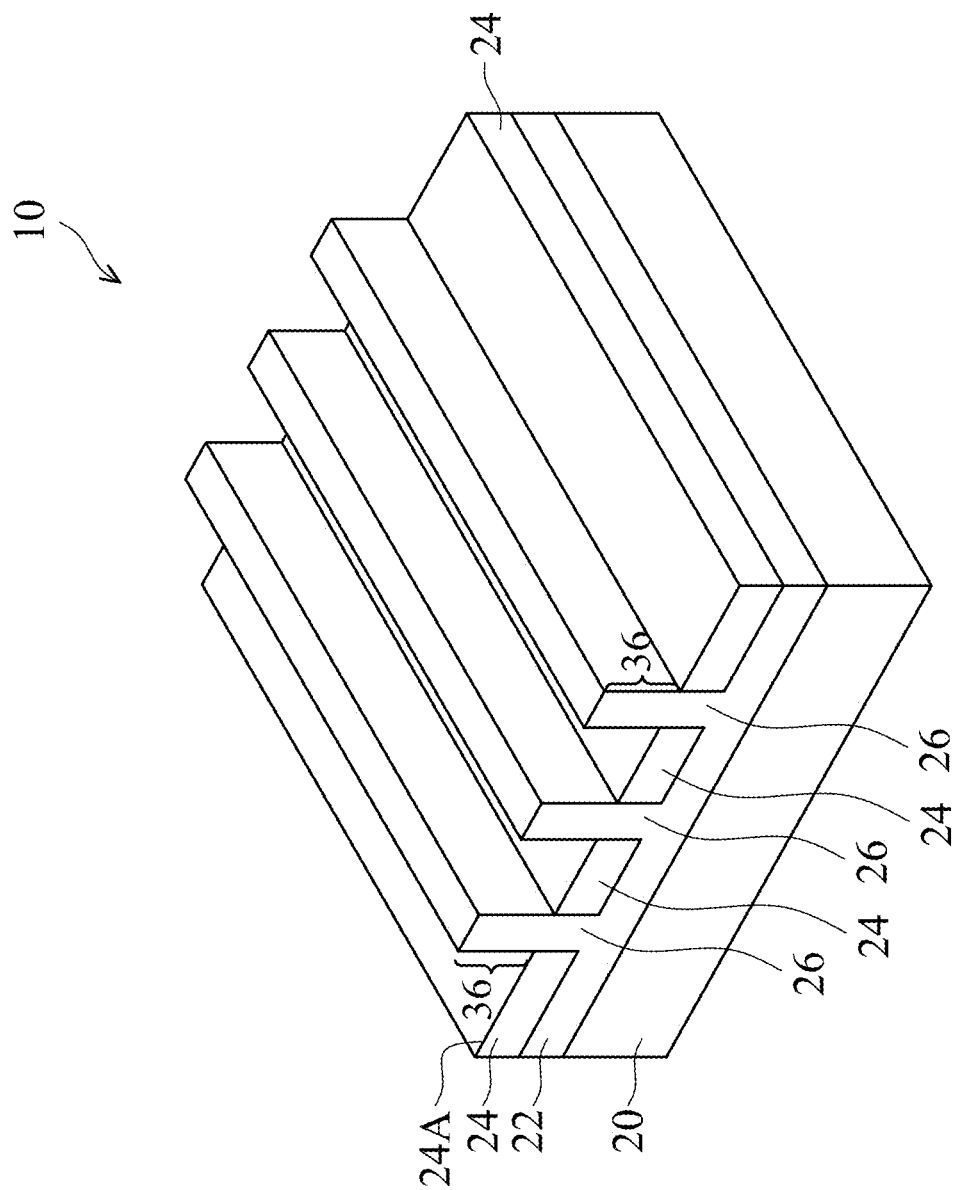

Referring to FIG. 3, STI regions 24 are recessed, so that the top portions of semiconductor strips 26 protrude higher than the top surfaces 24A of the remaining portions of STI regions 24 to form protruding fins 36. The respective process is illustrated as process 406 in the process flow 400 as shown in FIG. 23. The etching may be performed using a dry etching process, wherein $NF_3$ and $NH_3$, for example, are used as the etching gases. During the etching process, plasma may be generated. Argon may also be included. In accordance with alternative embodiments of the present disclosure, the recessing of STI regions 24 is performed using a wet etching process. The etching chemical may include HF, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4A:
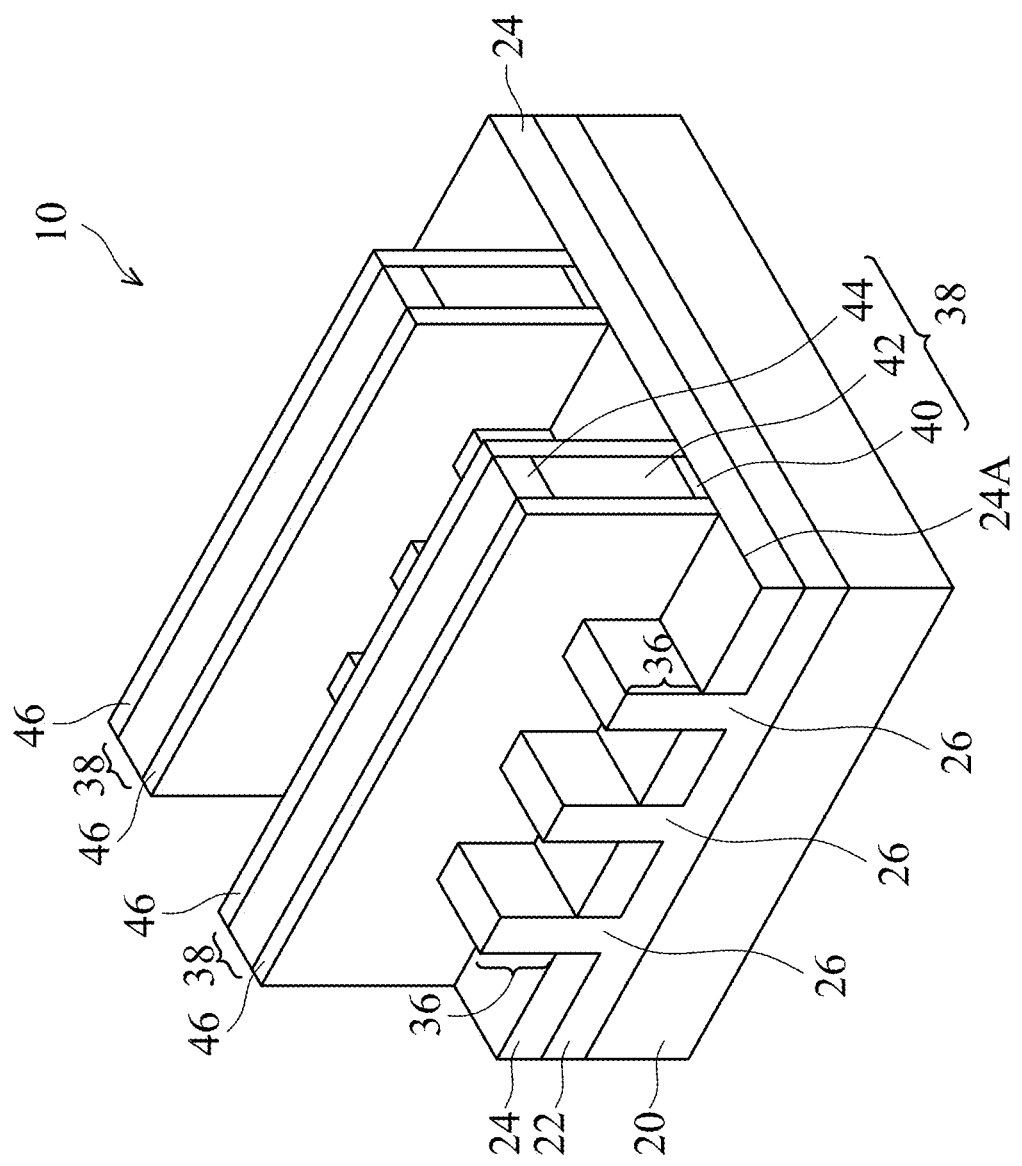

Referring to FIG. 4A, dummy gate stacks 38 are formed to extend on the top surfaces and the sidewalls of (protruding) fins 36. The respective process is illustrated as process 408 in the process flow 400 as shown in FIG. 23. The formation process may include depositing stacked layers, and then patterning the stacked layers to form dummy gate stacks 38. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of or comprise other dielectric materials such as SiN, SiON, SiOCN, SiOC, $SiO_2$, SiC, or the like, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Next, gate spacers 46 are formed on the sidewalls of dummy gate stacks 38. The respective process is also shown as process 408 in the process flow 400 as shown in FIG. 23. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers.

Figure 4B:
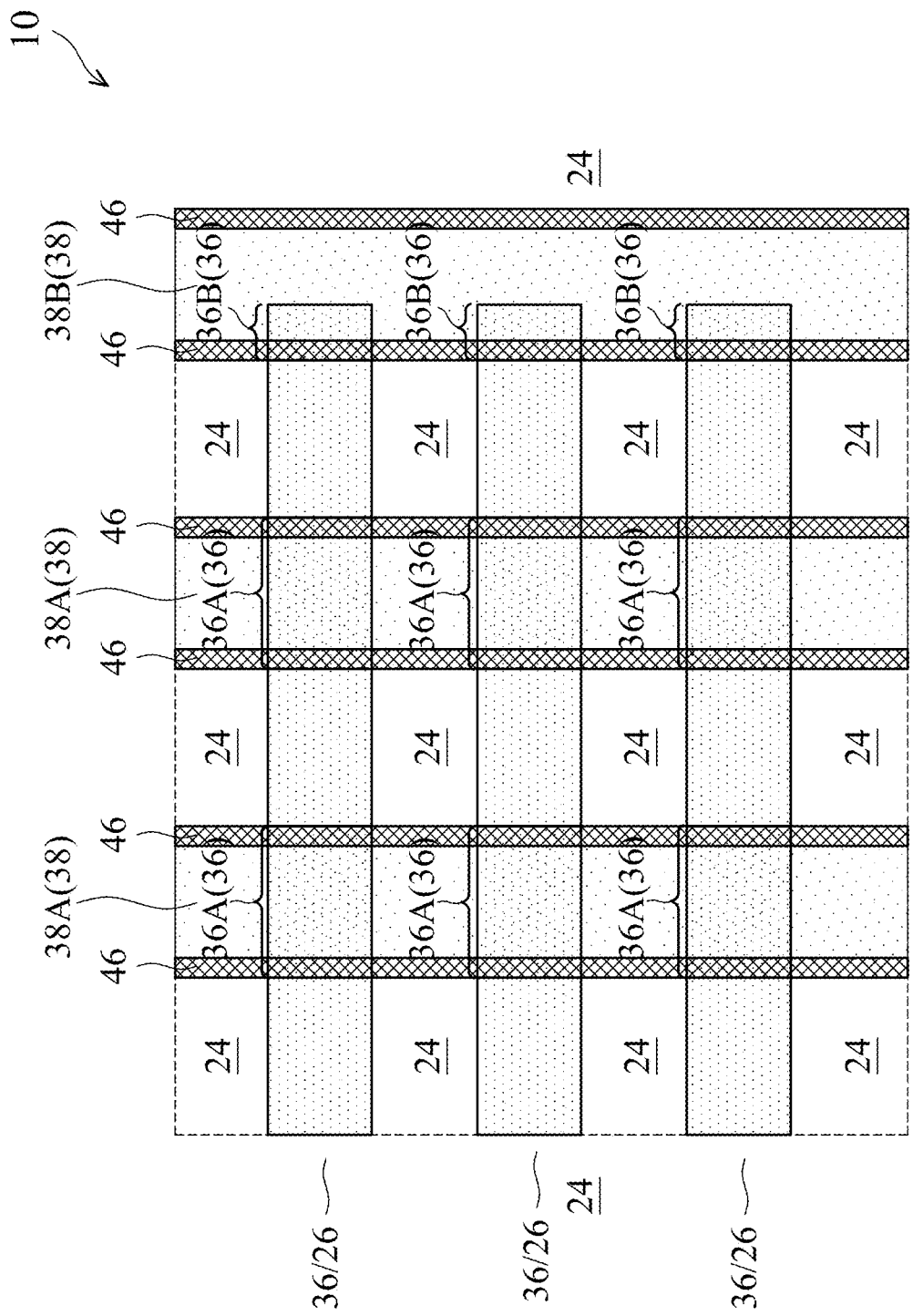

FIG. 4B illustrates a plane view of wafer 10, which includes the protruding fins 36, the dummy gate stacks 38, and gate spacers 46. Some of dummy gate stacks 38 (denoted as 38A) are on the intermediate portions 36A of protruding fins 36, and some other dummy gate stacks 38 (denoted as 38B) are on the end portions 36B of protruding fins 36. Protruding fins 36 are surrounded by STI regions 24. Each of dummy gate stacks 38B may include a first portion (such as the illustrated left portion) covering the end portions of protruding fins 36, and a second portion (such as the illustrated right portion) extending beyond protruding fins 36. In accordance with some embodiments, the dummy gate electrode 42 in dummy gate stacks 38B is referred to as Polysilicon on OD Edge (PODE), wherein the term "OD" represents the active region such as the protruding fins 36. Similarly, on the left ends (not shown) of protruding fins 36, there may also be a dummy gate stack 38B (not shown) covering the left edge portions of dummy gate stacks 38B.

Figure 5A:
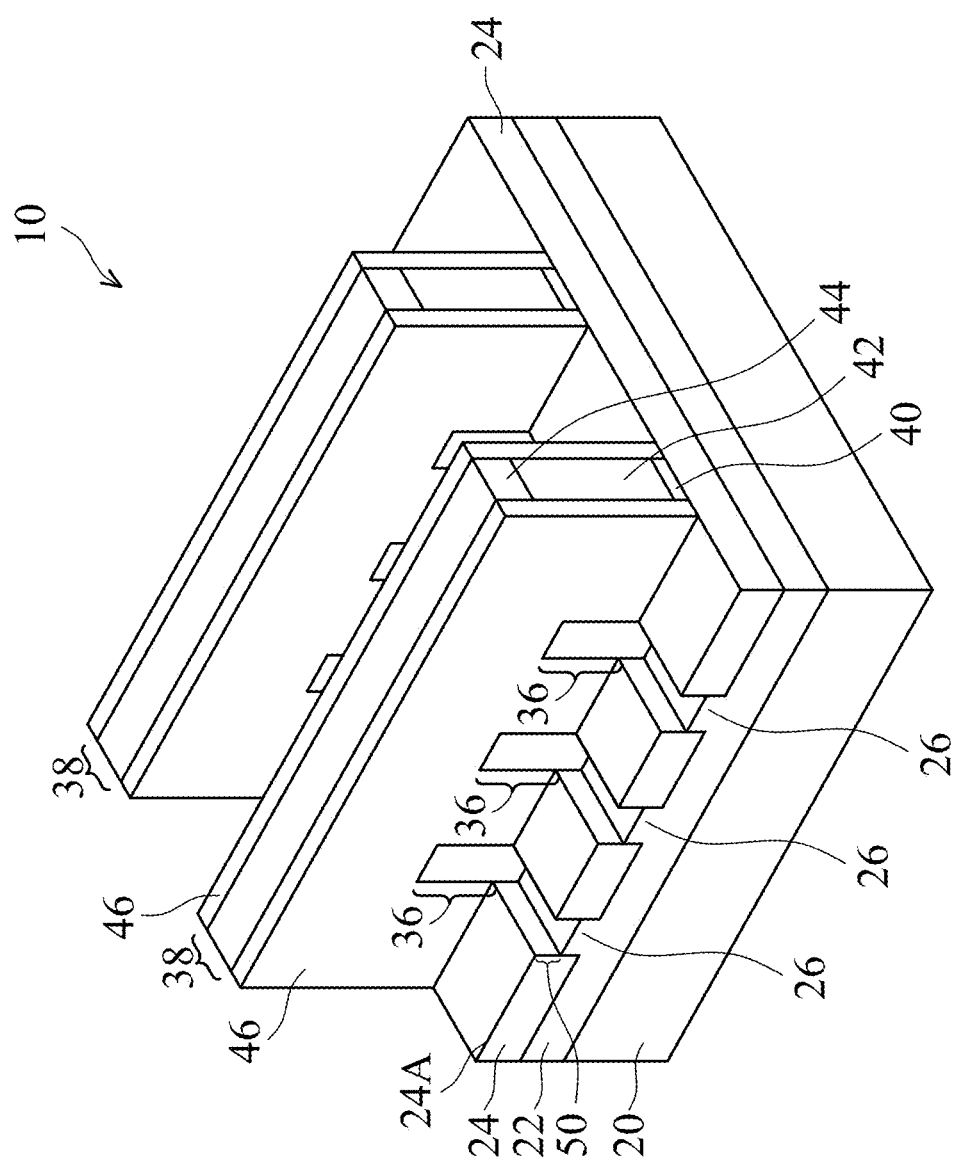

An etching process is then performed to etch the portions of protruding fins 36 that are not covered by dummy gate stacks 38 and gate spacers 46, resulting in the structure shown in FIG. 5A. The respective process is illustrated as process 410 in the process flow 400 as shown in FIG. 23. The recessing may be anisotropic, and hence the portions of fins 36 directly underlying dummy gate stacks 38 and gate spacers 46 are protected, and are not etched. The top surfaces of the recessed semiconductor strips 26 may be lower than the top surfaces 24A of STI regions 24 in accordance with some embodiments. Recesses 50 are accordingly formed. Recesses 50 comprise portions located on the opposite sides of dummy gate stacks 38, and portions between the remaining portions of protruding fins 36.

Figure 5B:
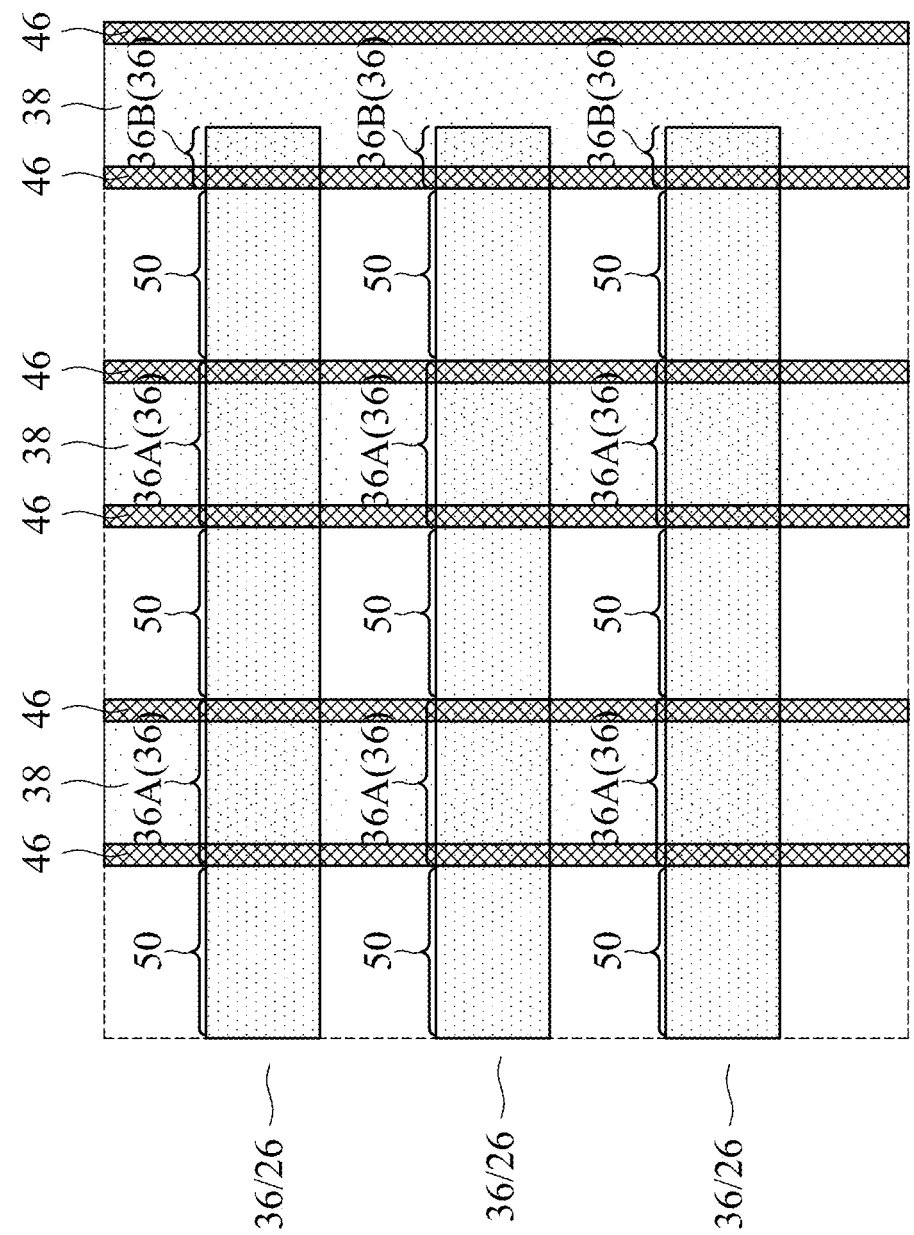

FIG. 5B illustrates a plane view of wafer 10 after the formation of recesses 50, wherein the illustrated portion correspond to the end portion as shown in FIG. 4B, and correspond to the structure shown in FIG. 5A.

Figure 6A:
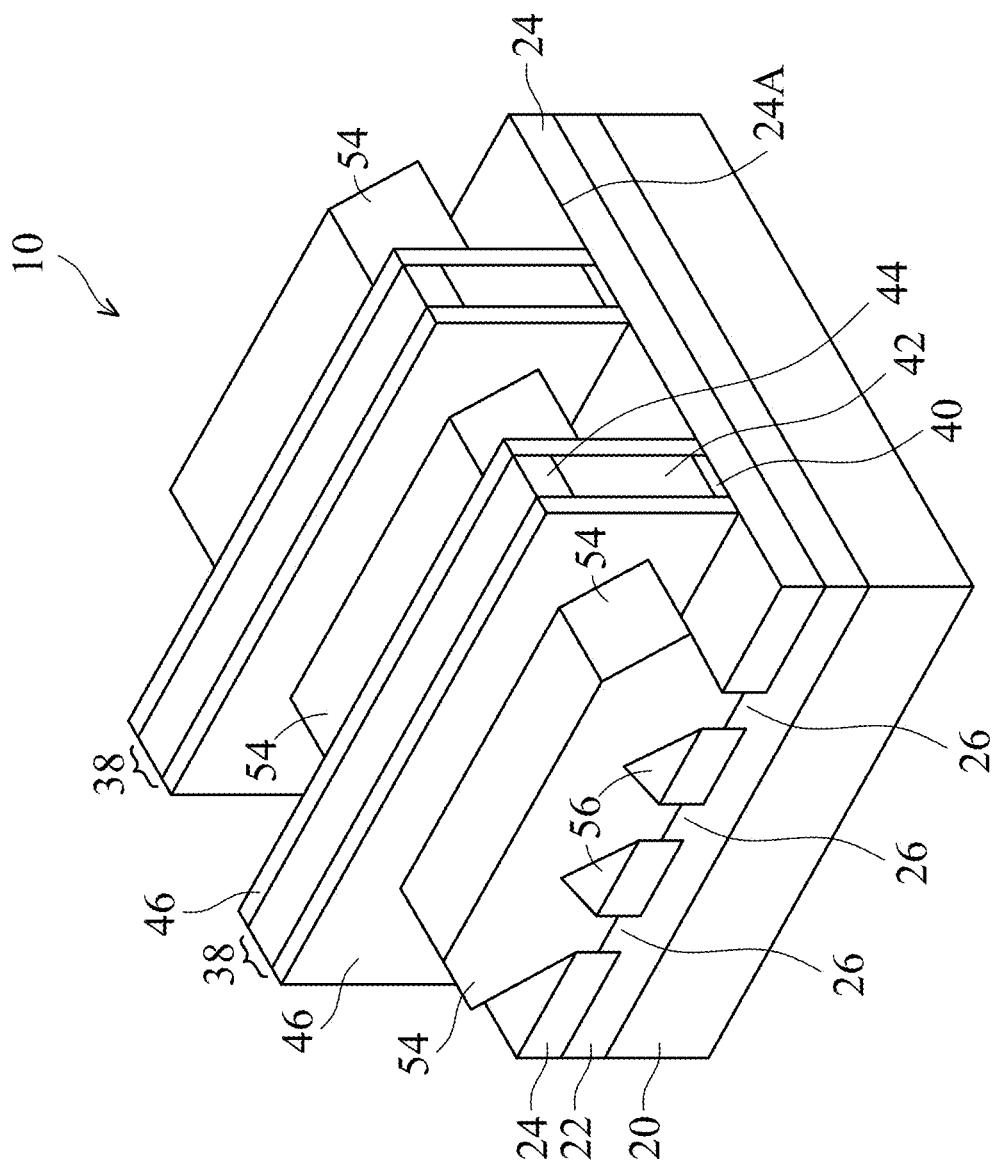

Next, epitaxy regions (source/drain regions) 54 are formed by selectively growing (through epitaxy) a semiconductor material in recesses 50, resulting in the structure in FIG. 6A. The respective process is illustrated as process 412 in the process flow 400 as shown in FIG. 23. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, silicon germanium boron (SiGeB), silicon boron (SiB), or the like may be grown. Conversely, when the resulting FinFET is an n-type FinFET, silicon phosphorous (SiP), silicon carbon phosphorous (SiCP), or the like may be grown. In accordance with alternative embodiments of the present disclosure, epitaxy regions 54 comprise III-V compound semiconductors such as GaAs, InP, GaN, InGaAs, InAlAs, GaSb, AlSb, AlAs, AlP, GaP, combinations thereof, or multi-layers thereof. After Recesses 50 are filled with epitaxy regions 54, further epitaxial growth of epitaxy regions 54 causes epitaxy regions 54 to expand horizontally, and facets may be formed. The further growth of epitaxy regions 54 may also cause neighboring epitaxy regions 54 to merge with each other. Voids (air gaps) 56 may be generated. In accordance with some embodiments of the present disclosure, the formation of epitaxy regions 54 may be finished when the top surface of epitaxy regions 54 is still wavy, or when the top surface of the merged epitaxy regions 54 has become planar.

After the epitaxy process, epitaxy regions 54 may be further implanted with a p-type or an n-type impurity to form source and drain regions, which are also denoted using reference numeral 54. In accordance with alternative embodiments of the present disclosure, the implantation step is skipped when epitaxy regions 54 are in-situ doped with the p-type or n-type impurity during the epitaxy.

Figure 6B:
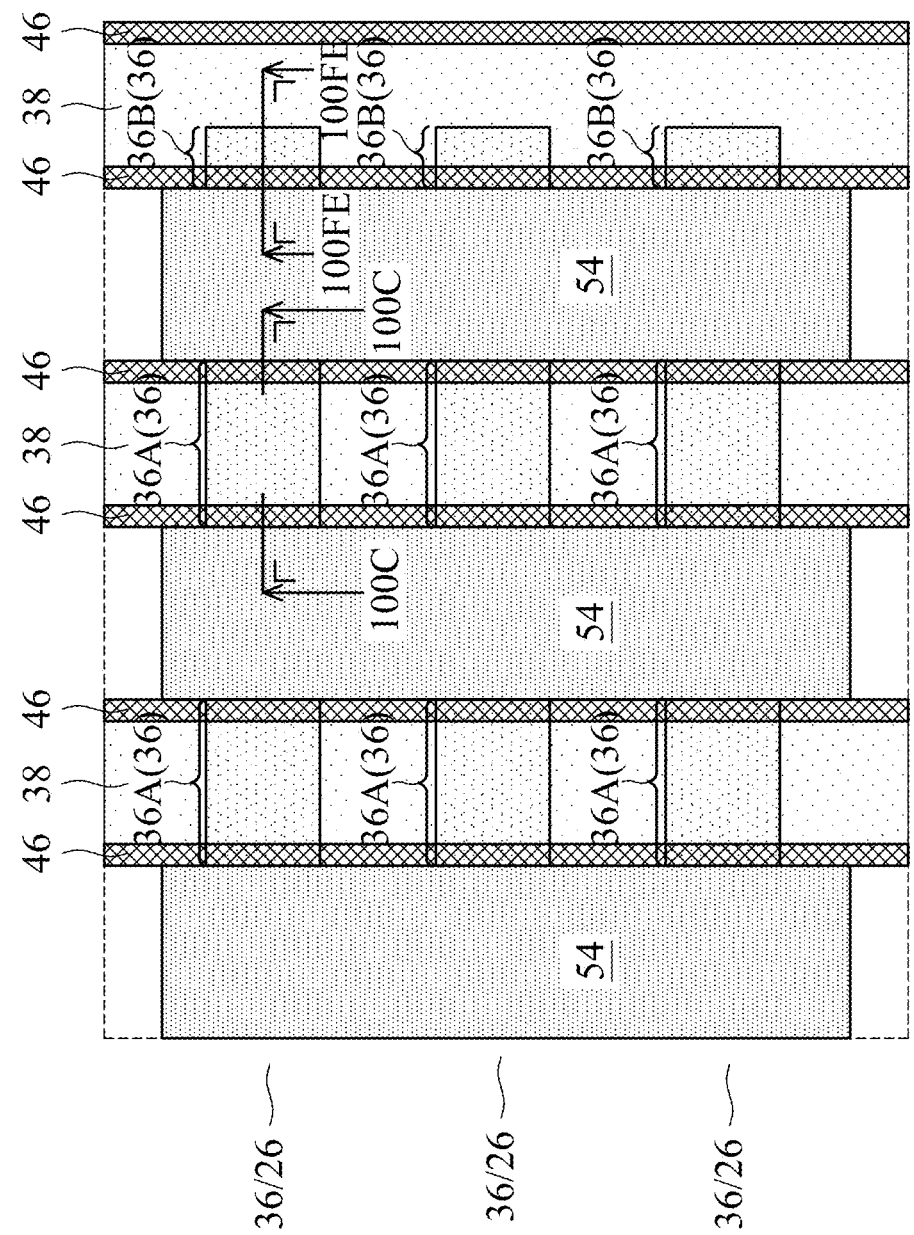

FIG. 6B illustrates a plane view of a portion of wafer 10, wherein the illustrated portion corresponds to the structure shown in FIG. 6A.

Figure 7A:
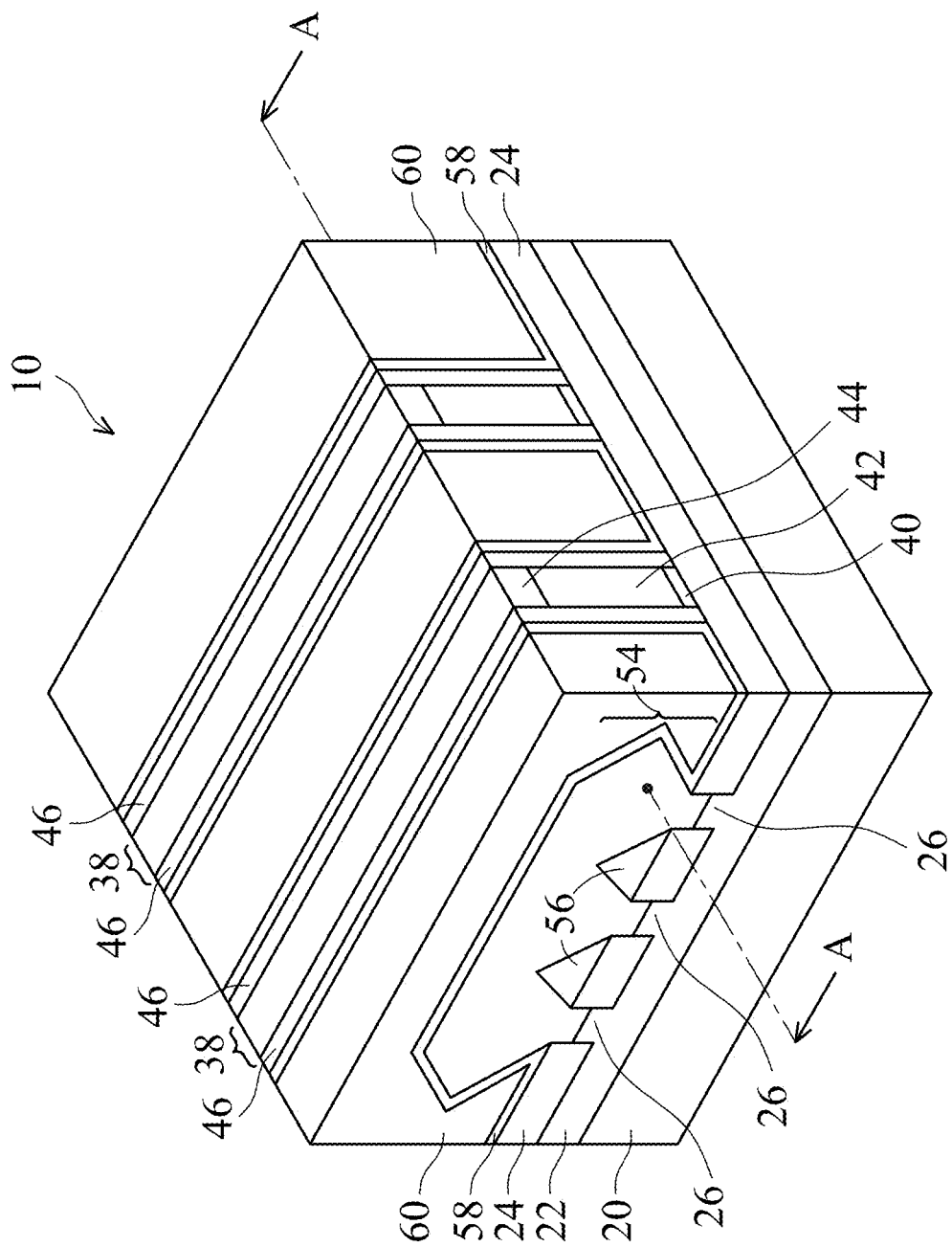

FIG. 7A illustrates a perspective view of the structure after the formation of Contact Etch Stop Layer (CESL) 58 and Inter-Layer Dielectric (ILD) 60. The respective process is illustrated as process 414 in the process flow 400 as shown in FIG. 23. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 7B:
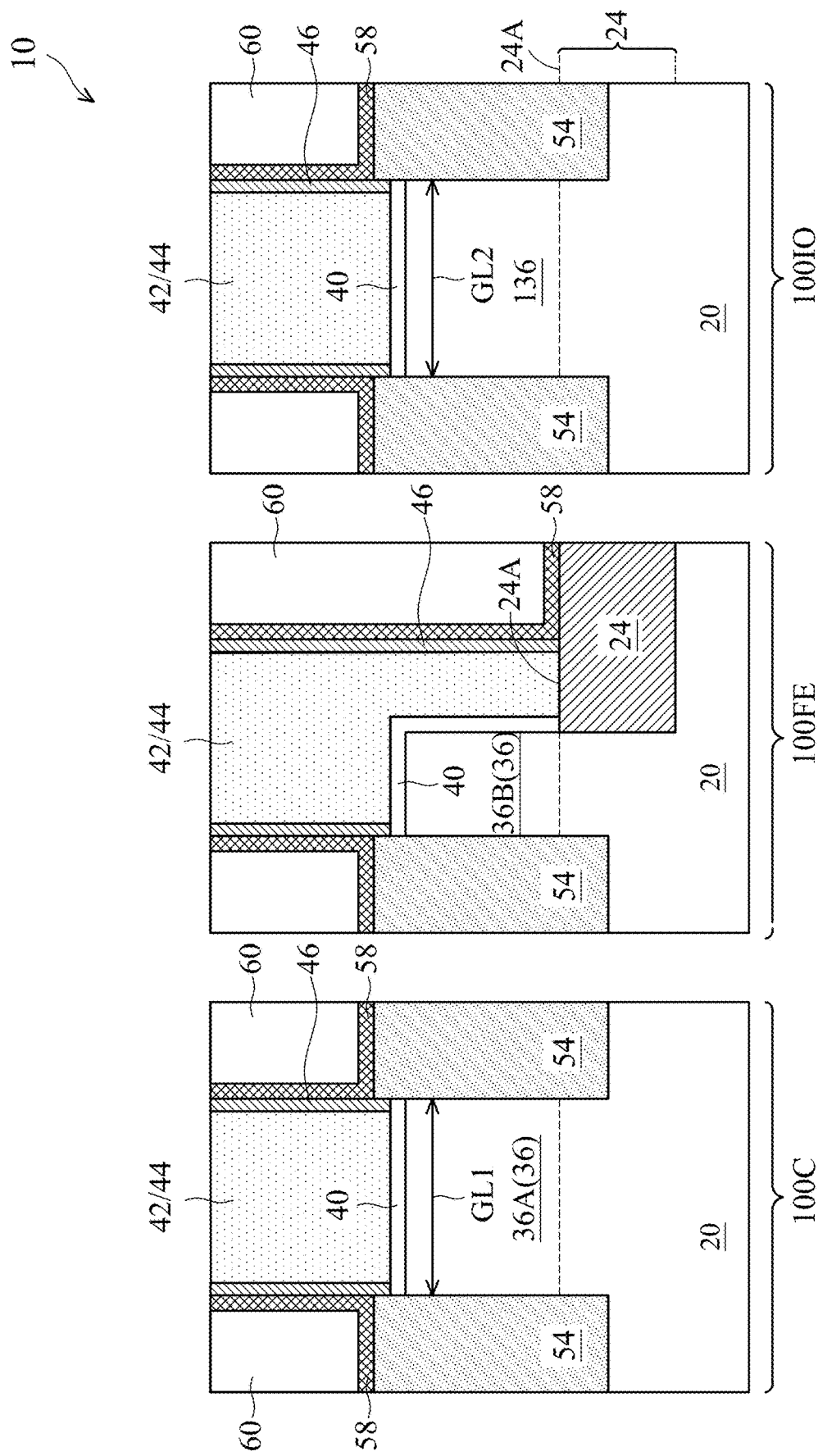

FIG. 7B illustrates the cross-sectional view of three device regions 100C, 100FE, and 100IO. The device region 100C may be a core (logic) device region for forming a first FinFET, which may be a core (logic) FinFET. The cross-sectional view shown in device region 100C may be obtained from the reference cross-section 100C-100C in FIG. 6B (except CESL 58 and ILD 60 are also shown in FIG. 7B). The device region 100FE is a device region for forming a fin-end gate structure. The cross-sectional view shown in device region 100FE may be obtained from the reference cross-section 100FE-100FE in FIG. 6B (except CESL 58 and ILD 60 are added). The device region 100IO may be a device region for forming a second FinFET, which may be an input/output (TO) FinFET. It is appreciated that the transistors in device regions 100C and 100IO may have different gate lengths. For example, gate length GL1 may be smaller than the gate length GL2 in accordance with some embodiments. The cross-sectional view of the structure shown in device region 100IO may be obtained from another protruding fin 136 (FIG. 8C, similar to fin 36) separated from the illustrated protruding fins 36, and the cross-section view is obtained from an intermediate portion of protruding fin 136.

It is appreciated that although a core device region and an IO device region are used as example, other device regions are also contemplated. In FIG. 7B, the gate dielectrics 40 in device regions 100C, 100FE, and 100IO may be formed sharing a common formation process, and hence have the same thickness. The gate dielectric 40 in device region 100C is removed in a subsequent process, and thus is a dummy gate dielectric. The gate dielectric 40 in device region 100IO acts as a functional gate dielectric of the IO FinFET, and thus is an active gate dielectric instead of a dummy gate dielectric. In FIG. 7B, STI regions 24 is illustrated, and protruding semiconductor fins 36 and 136 protrude higher than top surfaces 24A of the respective adjacent STI regions 24.

Figure 8A:
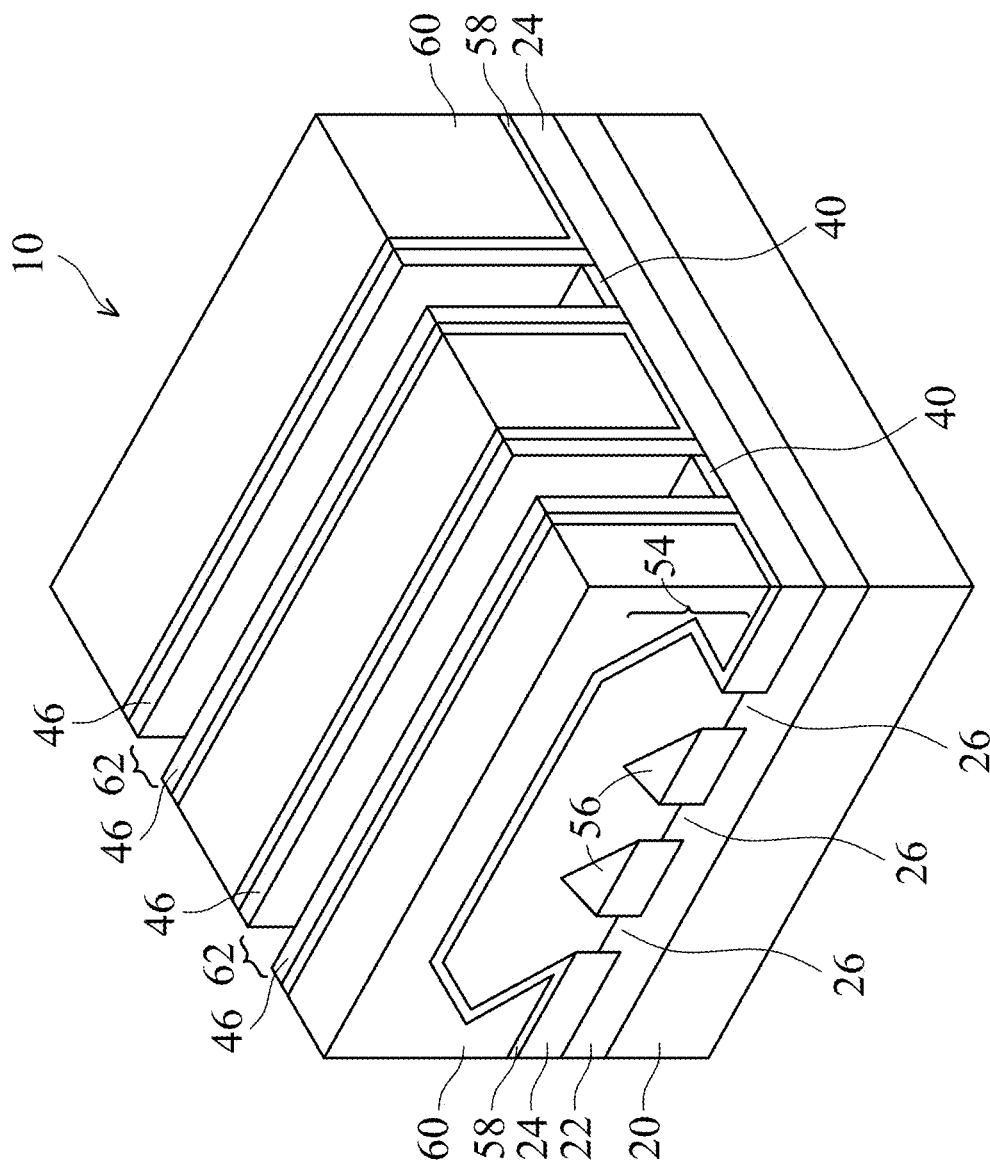
Figure 8B:
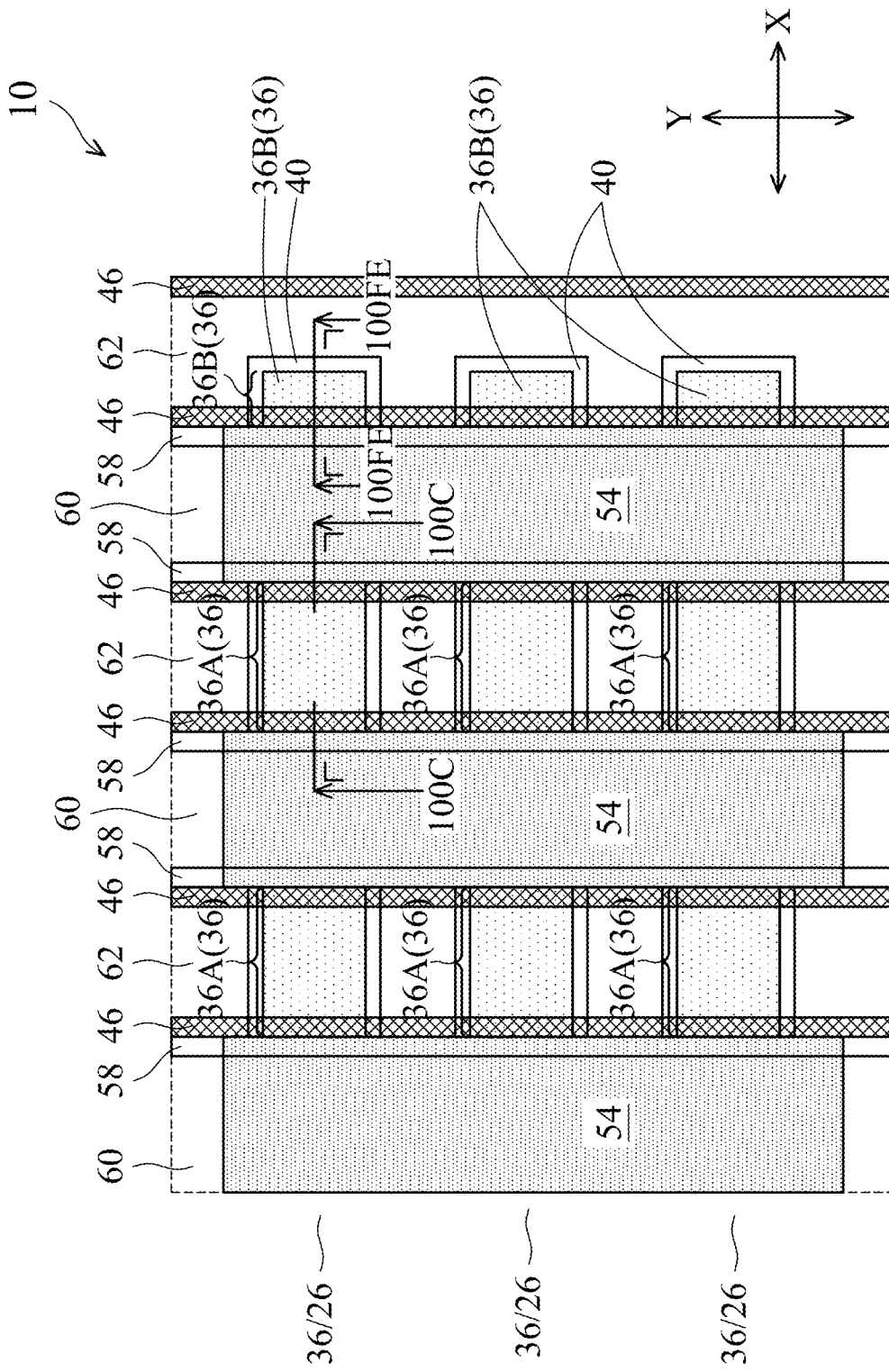
Figure 8C:
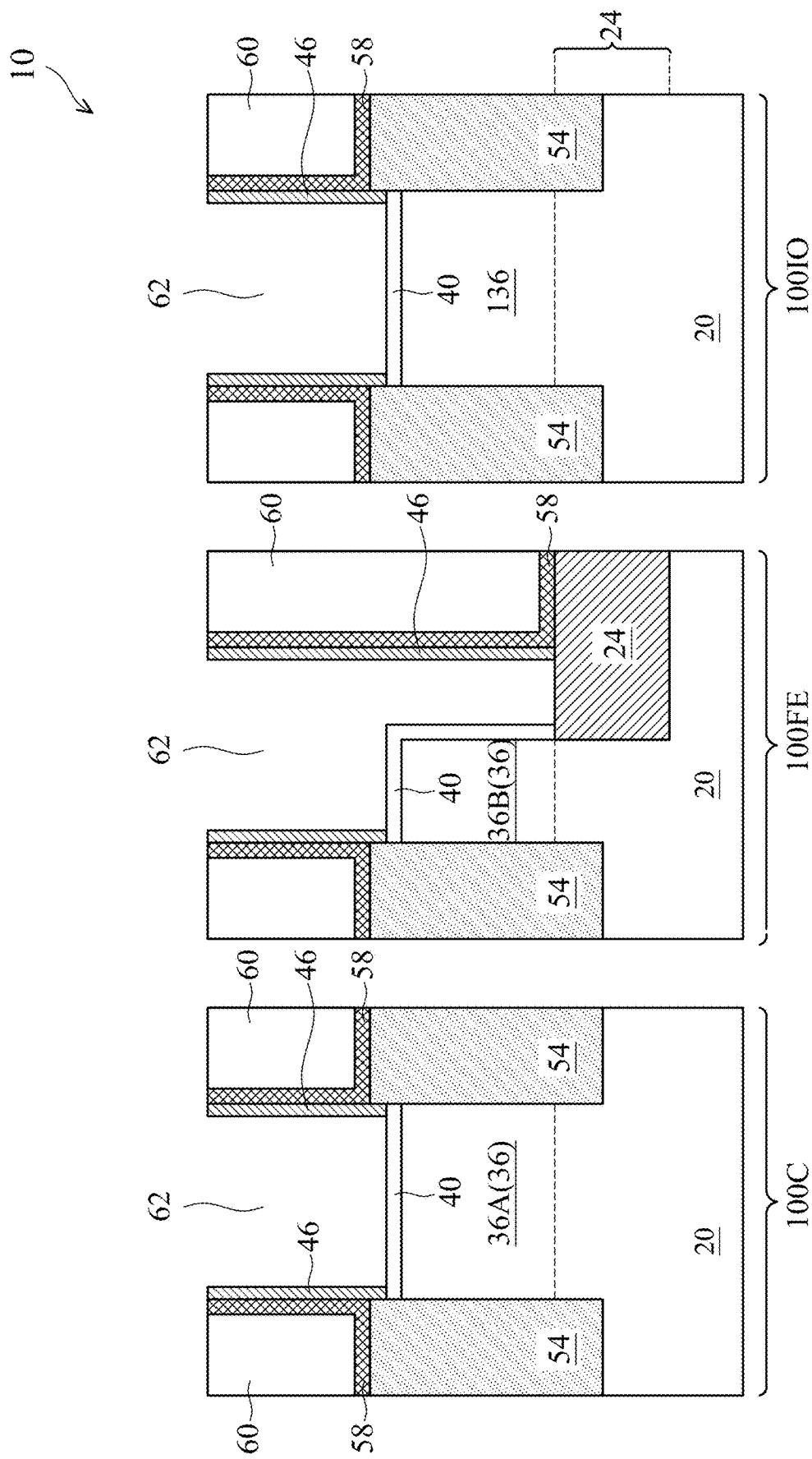

After the structures shown in FIGS. 7A and 7B are formed, the dummy gate stacks 38 are replaced with replacement gates, and the formation processes are shown in FIGS. 8A, 8B, 8C and 9-13. To form the replacement gates, hard mask layers 44 and dummy gate electrodes 42 as shown in FIGS. 7A and 7B are removed first, forming trenches 62 as shown in FIGS. 8A, 8B, and 8C. FIG. 8A illustrates a perspective view of a structure after the removal of hard mask layers 44 and dummy gate electrodes 42. Dummy gate dielectrics 40 (FIG. 8C) are thus exposed. The respective process is illustrated as process 416 in the process flow 400 as shown in FIG. 23. FIG. 8B illustrates a plane view of wafer 10.

As shown in FIG. 8B, gate dielectrics 40 are revealed through trenches 62. At this stage, gate dielectrics 40 cover protruding fins 36. Each of gate dielectrics 40 on the fin-end portion 36B includes three portions, with two portions on opposing sidewalls and extending in the lengthwise direction (X-direction) of the corresponding protruding fin-end portion 36B, and the third portion extending in the widthwise direction (Y-direction) of the corresponding protruding fin-end portion 36B.

FIG. 8C illustrates the cross-sectional view of device regions 100C, 100FE, and 100IO after the removal of the dummy gate electrodes. As shown in FIG. 8C, in device region 100FE, the gate dielectric 40 at the fin end is revealed, and in the illustrated cross-section, gate dielectric 40 also extends on the sidewall of protruding fin-end portion 36B. In accordance with some embodiments, the removal of hard mask layers 44 from device regions 100C, 100FE, and 100IO is performed in common processes, and the removal of dummy gate electrodes 42 from device regions 100C, 100FE, and 100IO is performed in common processes.

Figure 9:
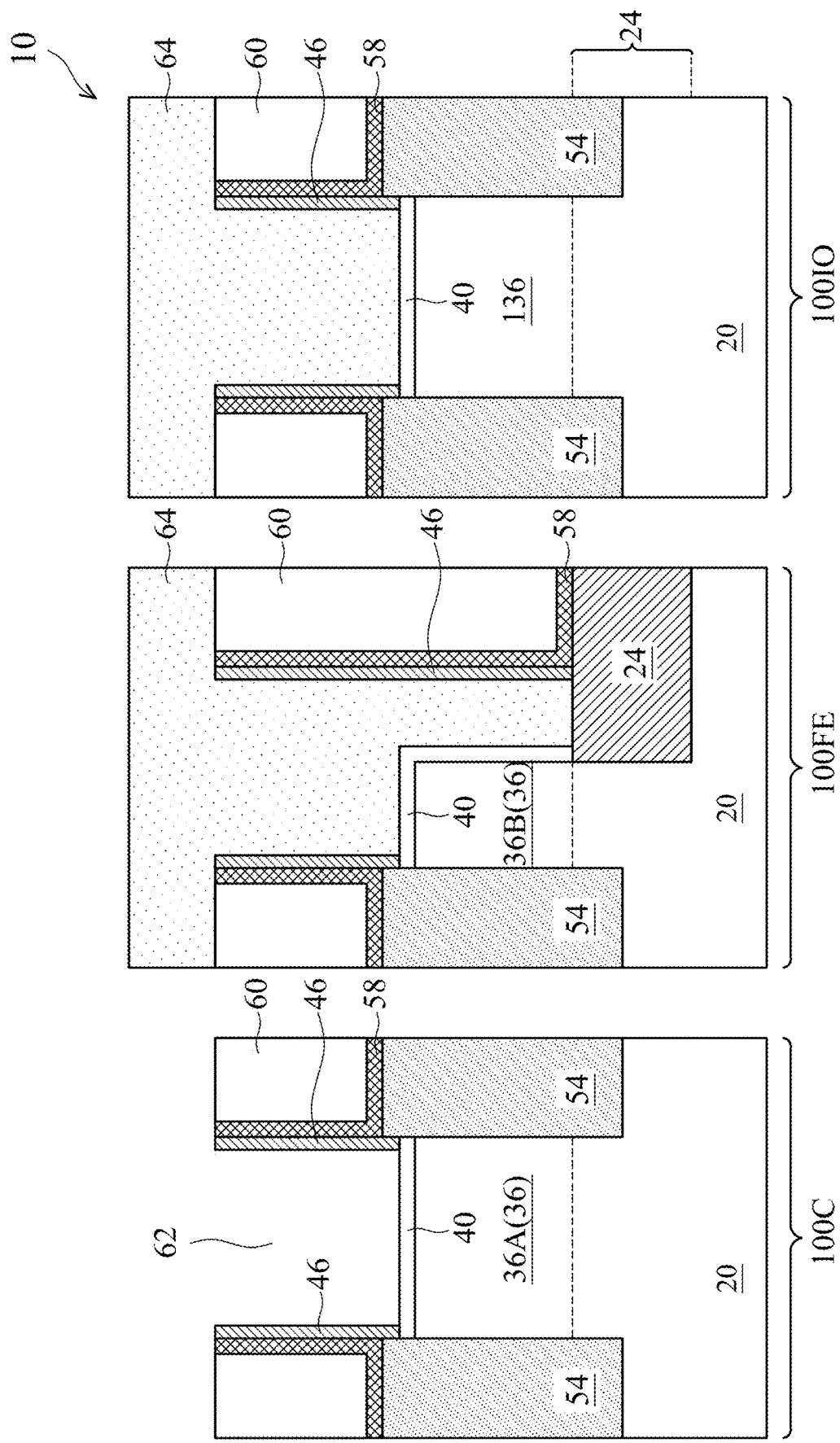

Referring to FIG. 9, an etching mask 64, which may be a photo resist, is formed and patterned. The patterned etching mask 64 is left in device regions 100FE and 100IO, and is removed from device region 100C. The respective process is illustrated as process 418 in the process flow 400 as shown in FIG. 23. Trench 62 in device regions 100FE and 100IO are filled by etching mask 64.

Figure 10:
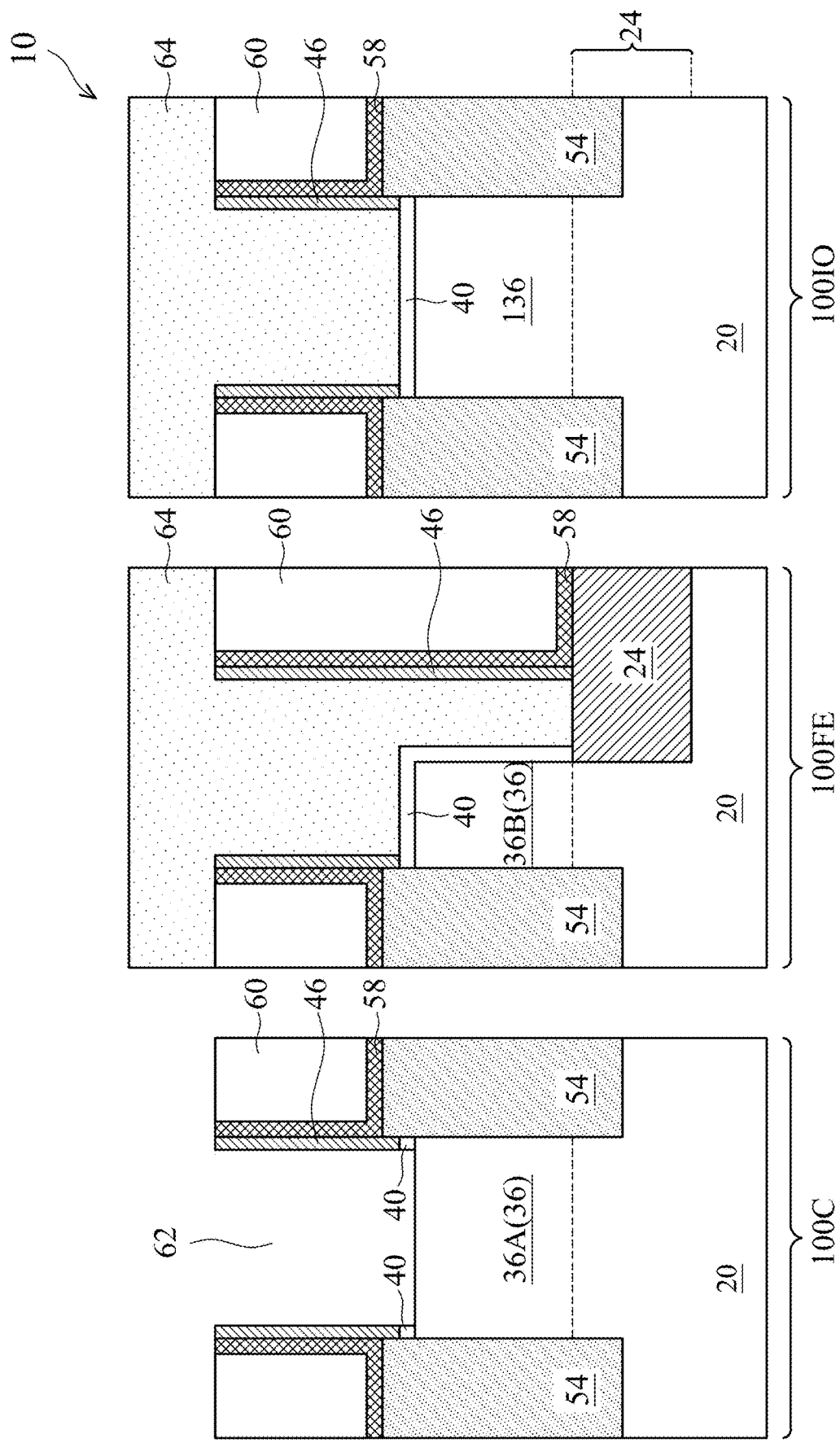

Next, referring to FIG. 10, an etching process is performed to remove the dummy gate dielectric 40 in device region 100C. The respective process is illustrated as process 420 in the process flow 400 as shown in FIG. 23. In accordance with some embodiments, the etching is anisotropic. In accordance with alternative embodiments, the etching is isotropic. In accordance with some embodiments in which dummy gate dielectric 40 is formed of or comprises silicon oxide, the mixture of $NF_3$ and $NH_3$ gases or the mixture of HF and $NH_3$ gases may be used. In accordance with other embodiments in which wet etching process is used, a HF solution or a like etchant may be used. When anisotropic etching is used, dummy gate dielectric 40 may have some residue portions left and overlapped by gate spacers 46. In other embodiments, dummy gate dielectric 40 is fully removed from the trench 62 in device region 100C. During the etching process, the gate dielectrics 40 in device regions 100FE and 100IO are protected from being etched.

Figure 11:
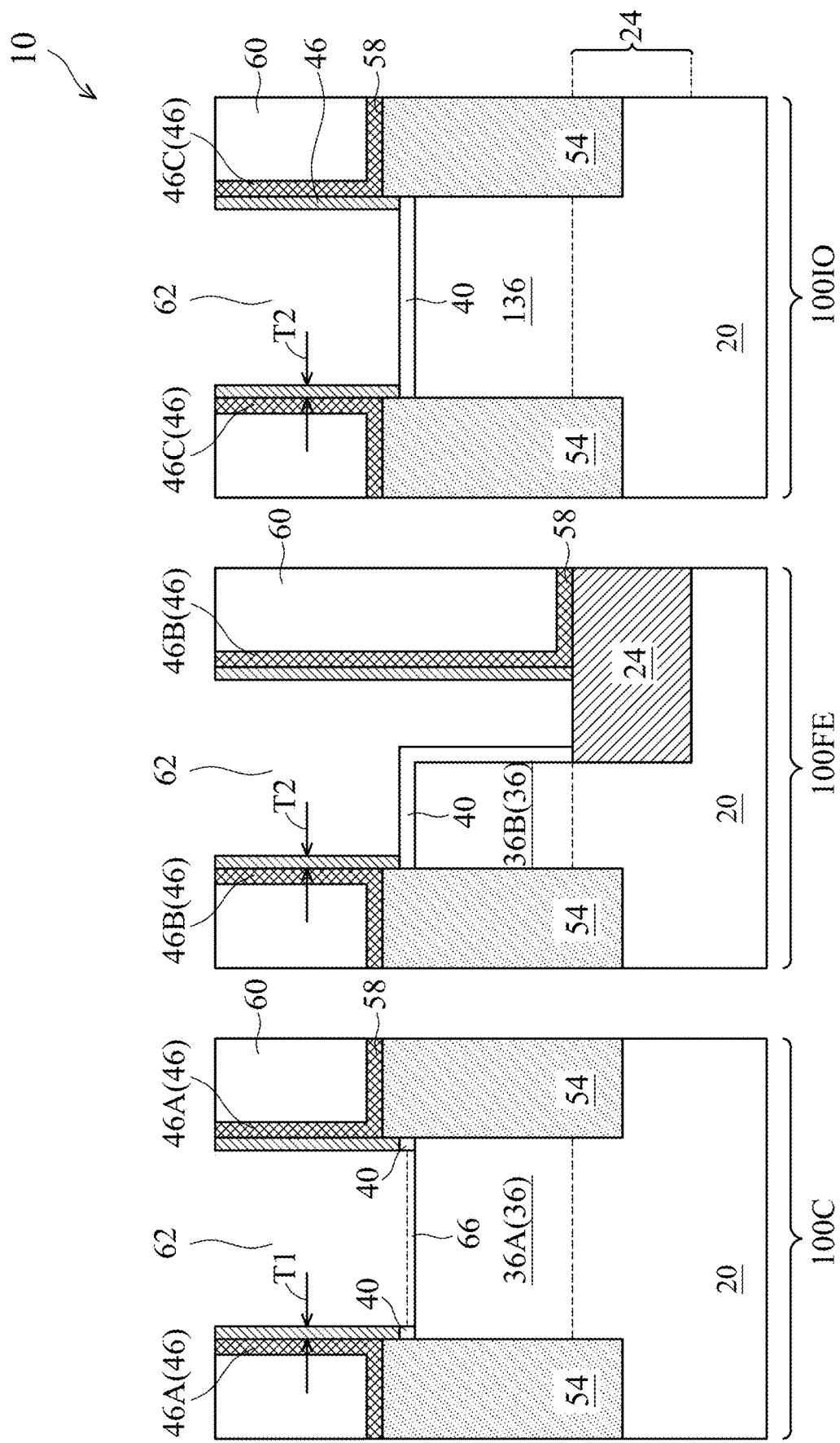

After the etching process, etching mask 64 is removed to reveal the gate dielectrics 40 in device regions 100FE and 100IO again. The resulting structure is shown in FIG. 11. The respective process is illustrated as process 422 in the process flow 400 as shown in FIG. 23. Since the gate spacers 46 in device region 100C is also exposed to the etchant for etching the dummy gate dielectric 40 in device region 100C, gate spacers 46 (marked as 46A) in device region 100C may be thinned by the etchant, and may be thinner than the gate spacers 46B and 46C in device regions 100FE and 100IO, respectively. In accordance with some embodiments, the thickness difference (T2−T1) may be in the range between about 1 nm and about 2 nm, wherein thickness T1 is the thickness of gate spacers 46A, and thicknesses T2 are the thicknesses of gate spacers 46B and 46C. The ratio (T2−T1)/T2 may be in the range between about 0.1 and about 0.3.

Figure 12:
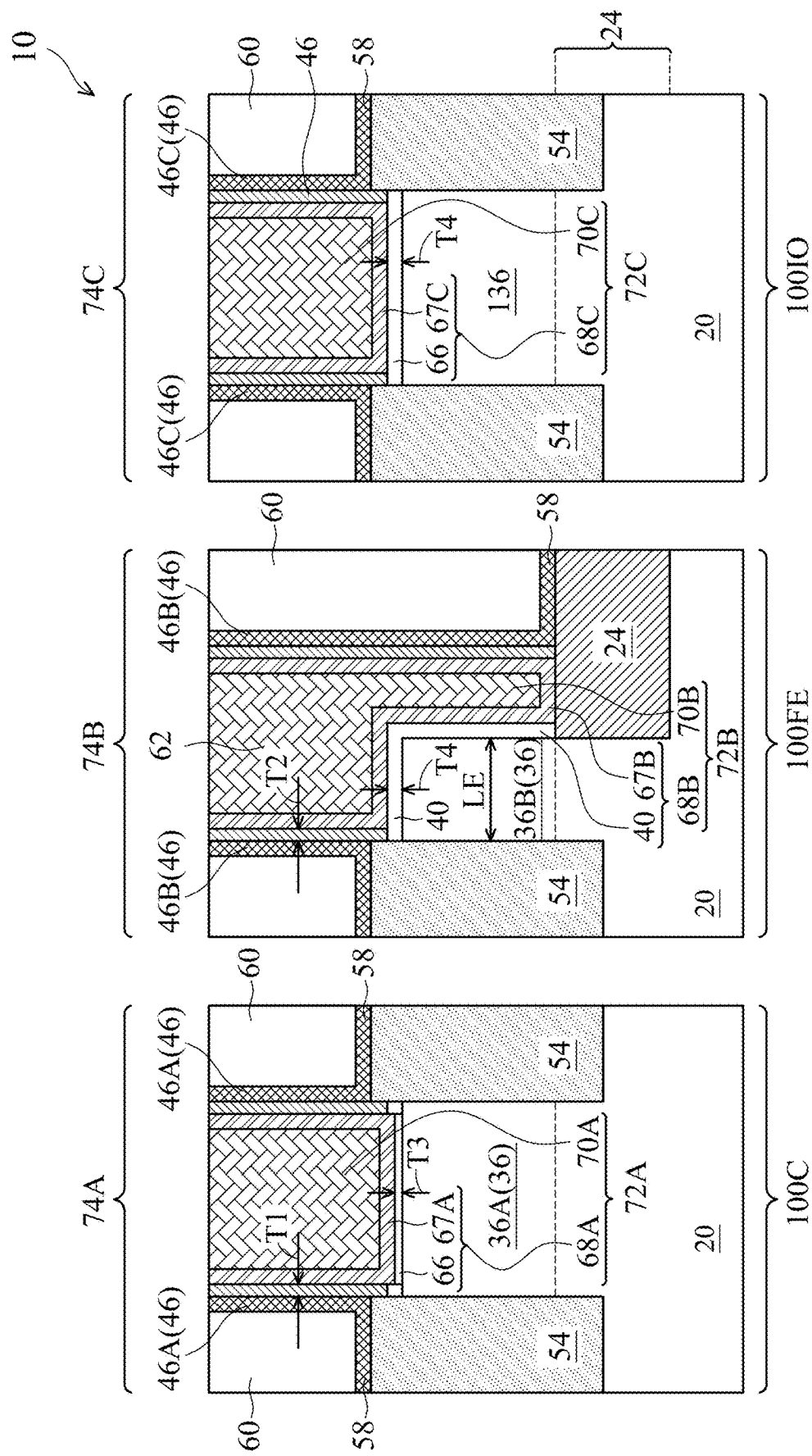

Next, referring to FIG. 12, gate stacks 72A, 72B, and 72C are formed, which includes gate dielectrics 68A, 68B, and 68C, and gate electrodes 70A, 70B, and 70C, respectively. FinFET 74A and FinFET 74C, which may be a core FinFET and an IO FinFET, respectively, are thus formed. Gate dielectric 68A may include dielectric layer 66 and high-k dielectric layer 67A. Dielectric layer 66 is formed on the exposed surfaces of protruding fin portion 36A, and may be formed of or comprise silicon oxide. The respective process is illustrated as process 424 in the process flow 400 as shown in FIG. 23. In accordance with some embodiments, dielectric layer 66 is an Interfacial Layers (IL), which may include a native oxide layer, as shown in FIG. 11. The native oxide layer is formed on the exposed surfaces of protruding fin 36 due to the exposure of the semiconductor material to moisture and oxygen. In accordance with some embodiments, dielectric layer 66, in additional to the native oxide, may also be formed through a chemical oxidation process or a thermal oxidation process. Dielectric layer 66 may also be formed of or comprise other dielectric materials such as SiN, SiON, SiOCN, SiOC, SiO$_2$, SiC, or the like. In device regions 100FE and 100IO, the original dielectric layers 40 remain.

After the formation of dielectric layer 66, high-k dielectric layers 67A, 67B, and 67C are formed. The respective process is illustrated as process 426 in the process flow 400 as shown in FIG. 23. Each of high-k dielectric layers 67A, 67B, and 67C may be formed of a high-k dielectric material such as hafnium oxide, lanthanum oxide, aluminum oxide, zirconium oxide, or the like, combinations thereof, or multi-layers thereof. In accordance with some embodiments of the present disclosure, high-k dielectric layers 67A, 67B, and 67C are formed using ALD, CVD, or the like. High-k dielectric layers 67A, 67B, and 67C may be portions of the same dielectric layer, and are formed simultaneously using the same material and having the same thickness, or separately with different materials and/or different thicknesses. Dielectric layer (IL) 66 and the overlying high-k dielectric layer 67A are collectively referred to as gate dielectric 68A. Dielectric layer 40 in device region 100FE and the overlying high-k dielectric layer 67B are collectively referred to as gate dielectric 68B. Dielectric layer 40 in device region 100IO and the overlying high-k dielectric layer 67C are collectively referred to as gate dielectric 68C. High-k dielectric layers 67A, 67B, and 67C may be formed in a same deposition process(es), and may have the same thickness.

Gate electrodes 70A, 70B, and 70C are then formed. The respective process is illustrated as process 428 in the process flow 400 as shown in FIG. 23. In accordance with some embodiments of the present disclosure, each of gate electrodes 70A, 70B, and 70C may have a composite structure including a plurality of layers. In accordance with some embodiments, gate electrodes 70A, 70B, and 70C are formed simultaneously and share common formation processes, and hence have same layers of materials and same thicknesses. In accordance with alternative embodiments, gate electrodes 70A, 70B, and 70C may be formed in separate processes, and may have the same or different structures, and have the same or different materials, with the same or different thicknesses.

In accordance with some embodiments, each of gate electrodes 70A, 70B, and 70C may have a diffusion barrier layer, a work function layer over the diffusion barrier layer, a capping layer over the work function layer, and a filling-metal region over the capping layer. The diffusion barrier layer may be formed of or comprise TiN, TiSiN, or the like. The work-function layer may be formed of or comprise materials that are selected according to whether the respective FinFETs formed in device regions 100C and 100IO are n-type FinFETs or p-type FinFETs. For example, when the FinFETs are n-type FinFETs, the corresponding work-function layers may include an aluminum-based layer (formed of or comprising, for example, TiAl, TiAlN, TiAlC, TaAlN, or TaAlC). When the FinFETs are p-type FinFETs, the corresponding work-function layer may include a TiN layer and a TaN layer. The capping layer (which are also referred to as blocking layers) may be formed of or comprise TiN, TaN, or the like. The diffusion barrier layer, the work function layer, and the capping layer may be deposited using ALD, CVD, or the like. The filling metal regions may be formed of or comprise tungsten, cobalt, or the like.

In FIG. 12, dielectric layer 66 is formed in different processes than the dielectric layers 40 in device regions 100FE and 100IO. Since dielectric layers 40 in device region 100IO may be used in the IO device, they are relatively thick, for example, with thickness T4 in the range between about 10 Å and about 60 Å. Also, the thicknesses of dielectric layers 40 in device regions 100FE and 100IO may be equal to each other or substantially equal to each other, for example, with a difference smaller than about 20 percent. Dielectric layer 66, on the other hand, may be formed for a core device, and the thickness T3 is smaller than thickness T4. For example, thickness T3 may be in the range between about 5 Å and about 20 Å. Ratio T4/T3 is related to the performance and reliability requirements of the devices in device regions 100C and 100IO. For example, the Effective Oxide Thickness (EOT) of the device in device region 100C is low to achieve a fast speed, and thickness T3 is small, while a greater thickness T4 may improve the device reliability of the IO device. Accordingly, the ratio T4/T3 may be in the range between about 4.0 and about 6.0 in accordance with some embodiments.

Figure 13:
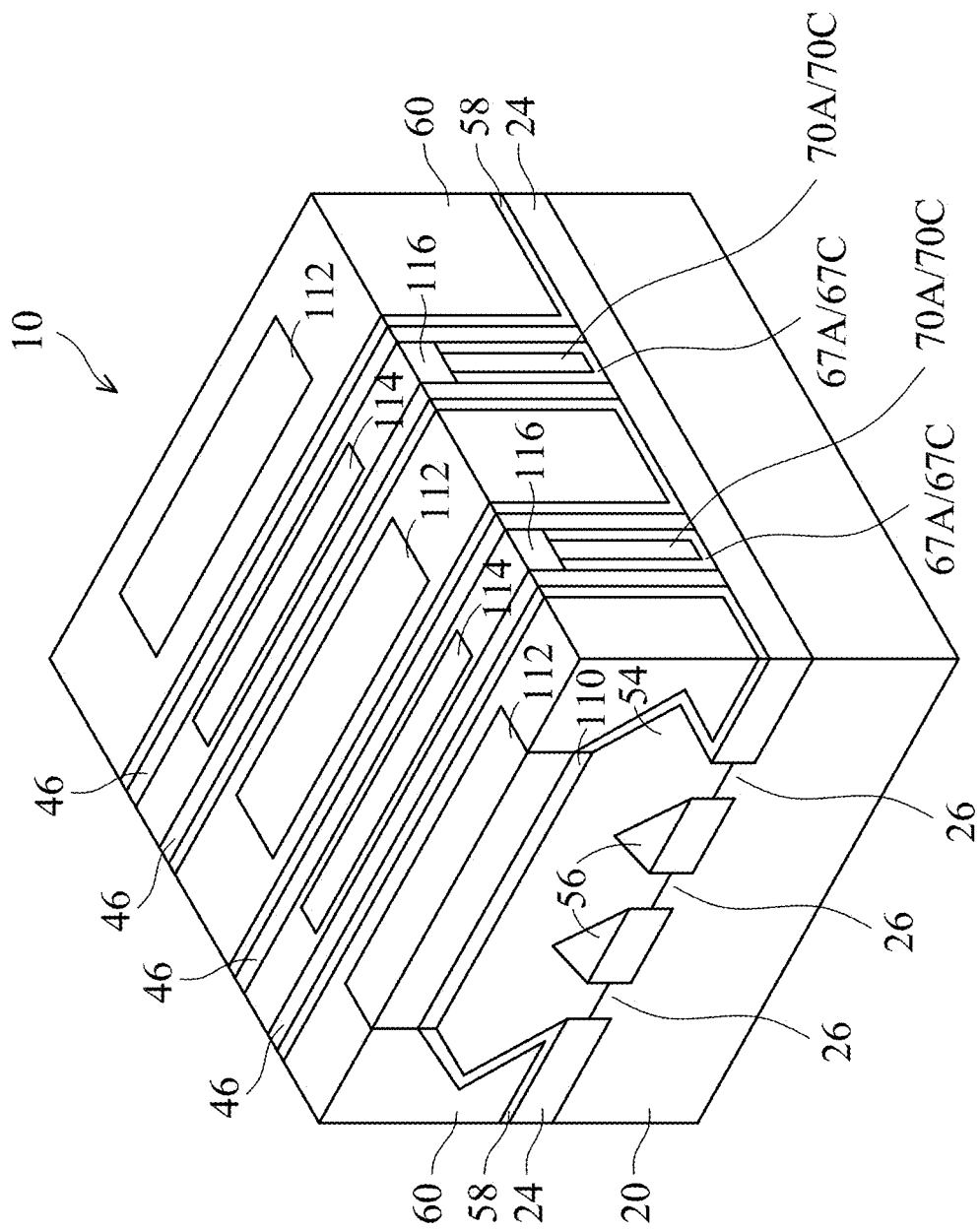

FIG. 13 illustrates a perspective view of a FinFET 74A or 74C. Gate contact plugs 114, source/drain silicide regions 110, source/drain contact plugs 112, and hard masks 116 are illustrated.

In the above-formation process, for example, the process as shown in FIGS. 10 and 11, when dielectric layer 40 is removed from the device region 100C, dielectric layer 40 is not removed from the fin-end device region 100FE. Since the length LE (FIG. 12) of the fin-end portion 36B becomes increasingly smaller with the advance of integrated circuits, the fin-end portion 36B may be damaged, for example, in the subsequent cleaning processes. If the fin-end portion 36B is damaged, the neighboring source/drain region 54 may be damaged. Accordingly, keeping the dielectric layer 40 to be left in device region 100FE has the function of protecting the underlying end portions 36B of protruding fin 36, and protecting neighboring source/drain regions.

The embodiments of the present disclosure may be applied on other protruding structures, and may be used for forming other types of transistors such as nano-sheet transistors, nano-wire transistors, and/or Gate-All-Around (GAA) transistors and the corresponding fin-end gate structures. FIGS. 14-21, 22A, and 22B illustrate cross-sectional views of intermediate stages in the formation of a GAA transistor (which may also be a nano-sheet or nano-wire transistor) and a corresponding fin-end gate structure in accordance with some embodiments of the present disclosure. Unless specified otherwise, the materials and the formation processes of the components in these embodiments are essentially the same as the like components, which are denoted by like reference numerals in the preceding embodiments shown in the preceding figures. The details regarding the formation process and the materials of the components shown in the preceding figures may thus be found in the discussion of the preceding embodiments.

Figure 14:
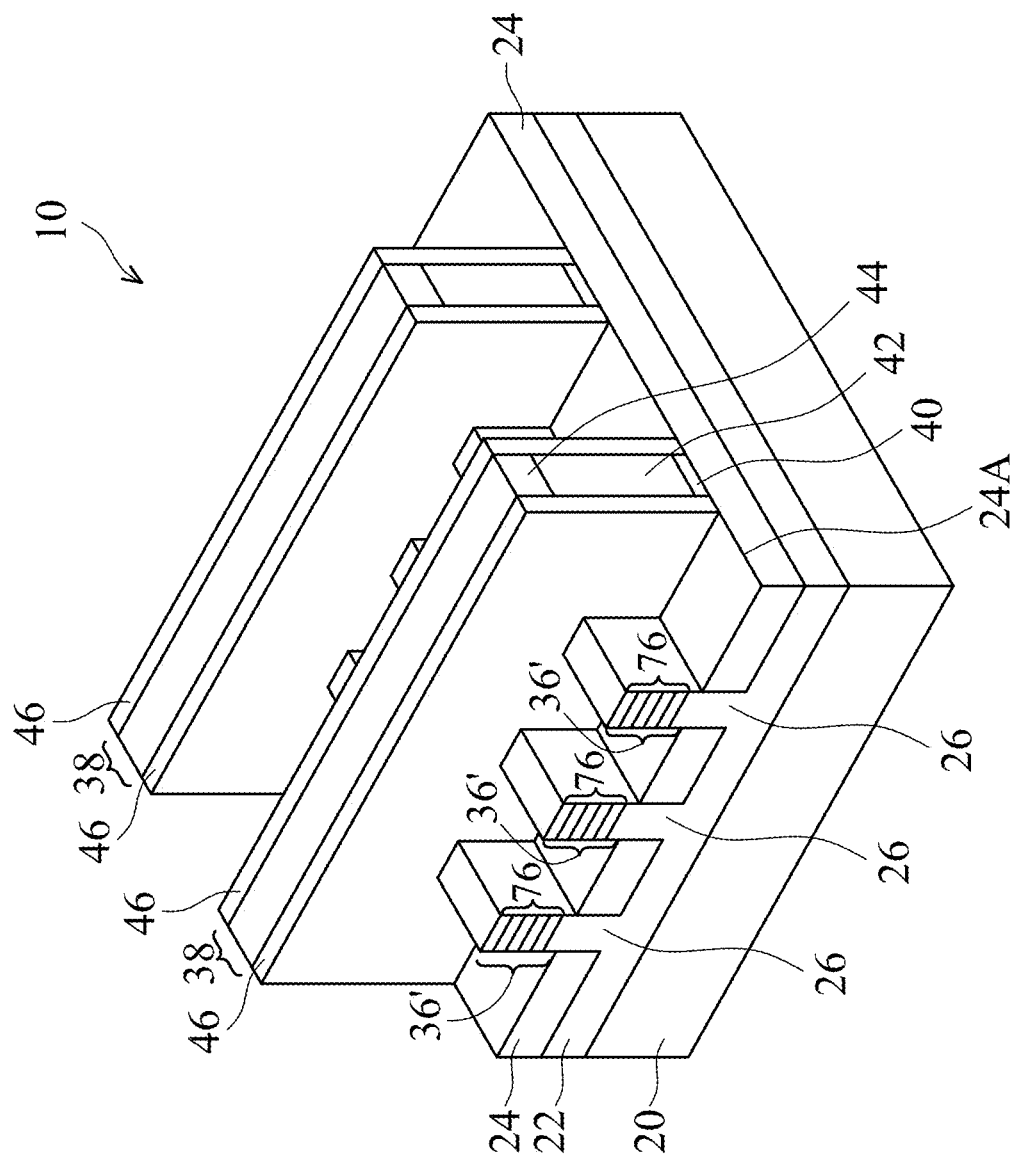
FIGS. 14-21, 22A, and 22B illustrate the perspective views, top views, and cross-sectional views of intermediate stages in the formation of Gate All-Around (GAA) Transistors and fin-end gate structures in accordance with some embodiments.

Referring to FIG. 14, protruding fins 36' are formed, and gate stack 38 and gate spacers 46 are formed on the sidewalls and the top surfaces of protruding fins 36'. Protruding fins 36' may include stacked layers 76, which includes channel layers 78 (refer to FIG. 15 for details) and sacrificial films 80. The total number of channel layers 78 and the total number of sacrificial films 80 may be in the range between, and including, 1 and about 10, for example. It is appreciated that although in the illustrated example embodiments, a sacrificial film 80 is shown as being the top layer of the stacked layer 76, a channel layer may be the top layer of the stacked layer 76 in accordance with other embodiments. The material of channel layers 78 and sacrificial films 80 are different from each other. In accordance with some embodiments, the channel layers 78 are formed of or comprise Si, SiGe, or the like. The sacrificial films 80 may be formed of or comprise SiGe, SiP, SiOCN, SiC, or the like. The thicknesses of each of channel layers 78 and sacrificial films 80 may be in the range between about 30 Å and about 1,000 Å. Stacked layers 76 overlap semiconductor strips 26. The formation process of the structure shown in FIG. 14 is similar to the processes shown in FIGS. 1-3 and 4A, except that the stacked layers 76 are pre-formed, for example, through epitaxy, before the processes as shown in FIGS. 1 through 3 are performed.

Figure 15:
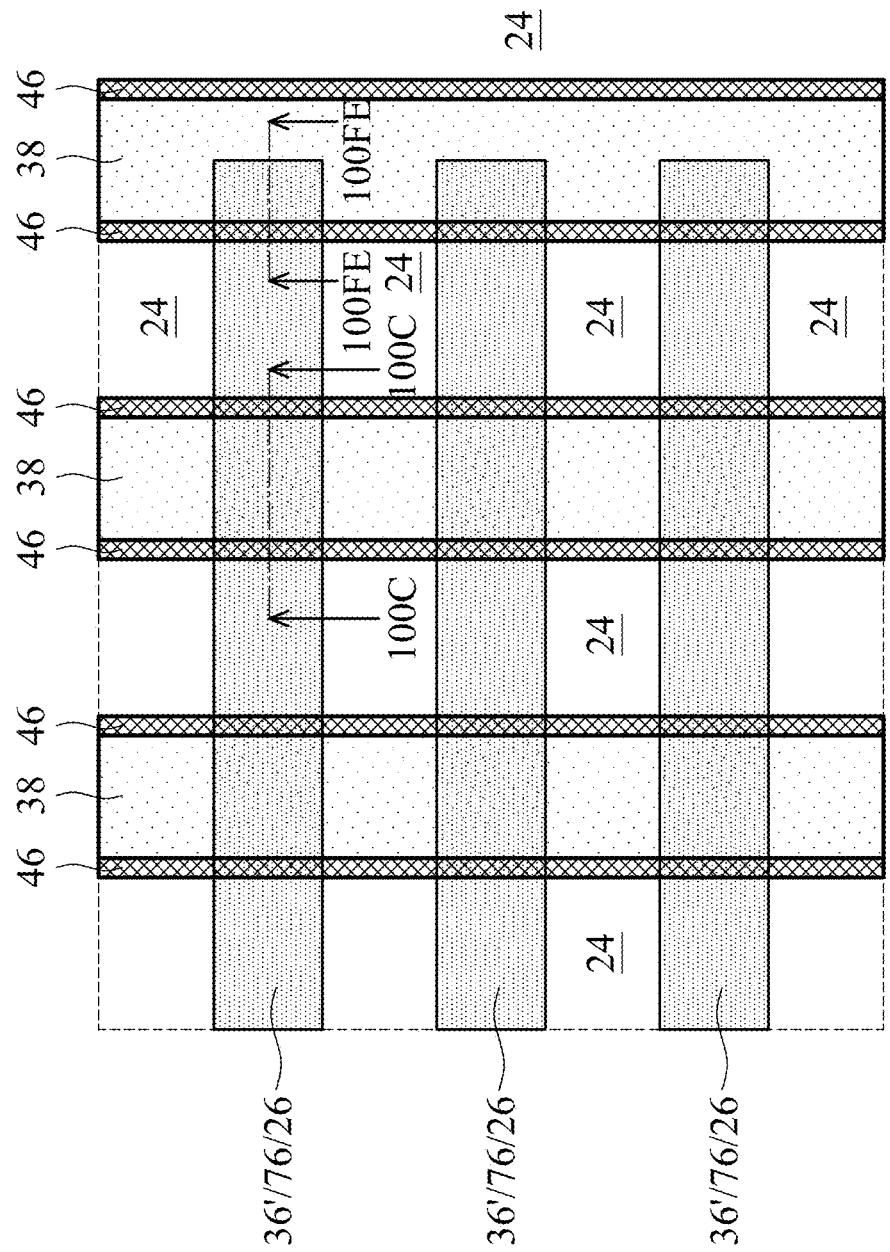

FIG. 15 illustrates a top view of the structure shown in FIG. 14. This top view is also similar to the top view shown in FIG. 4B, except that protruding fins 36' in FIG. 14 have replaced the protruding fins 36 in FIG. 4B.

Figure 16:
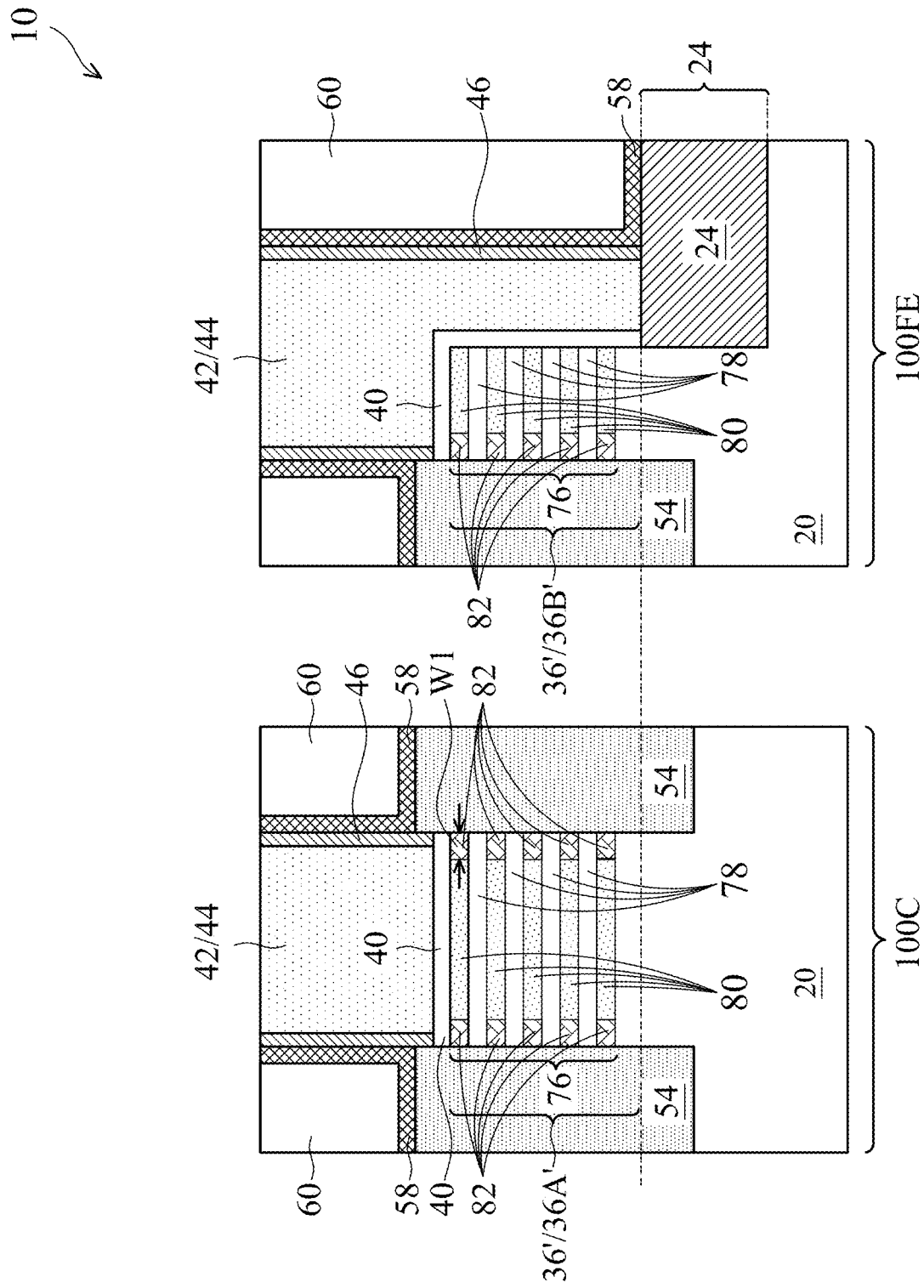

Subsequently, the processes shown in FIGS. 5A, 5B, 6A, 6B, 7A, and 7B are performed to form source/drain regions 54, CESL 58, and ILD 60. The resulting structure is shown in FIG. 16, which includes the cross-sectional view obtained from an intermediate portion and an end portion, respectively, of a same protruding fin 36'. FIG. 16 illustrates the cross-sectional views of the structures in device regions 100C and 100FE, which cross-sectional views are obtained from the reference cross-sections 100C-100C and 100FE-100FE, respectively, as shown in FIG. 15. In FIG. 16, inner spacers 82 are formed. In an example formation process of inner spacers 82, after the fin-etching process shown in FIG. 5A, the sidewalls of sacrificial film 80 are exposed. An oxidation process is performed to oxidize the end portions of sacrificial film 80, so that oxide regions are formed to act as inner spacers 82. The material of inner spacers 82 may depend on the material of sacrificial films 80, and may include the oxides of SiGe, SiP, SiOCN, SiC, or the like. The width W1 of inner spacers 82 may be in the range between about 3 Å and about 500 Å.

Figure 17:
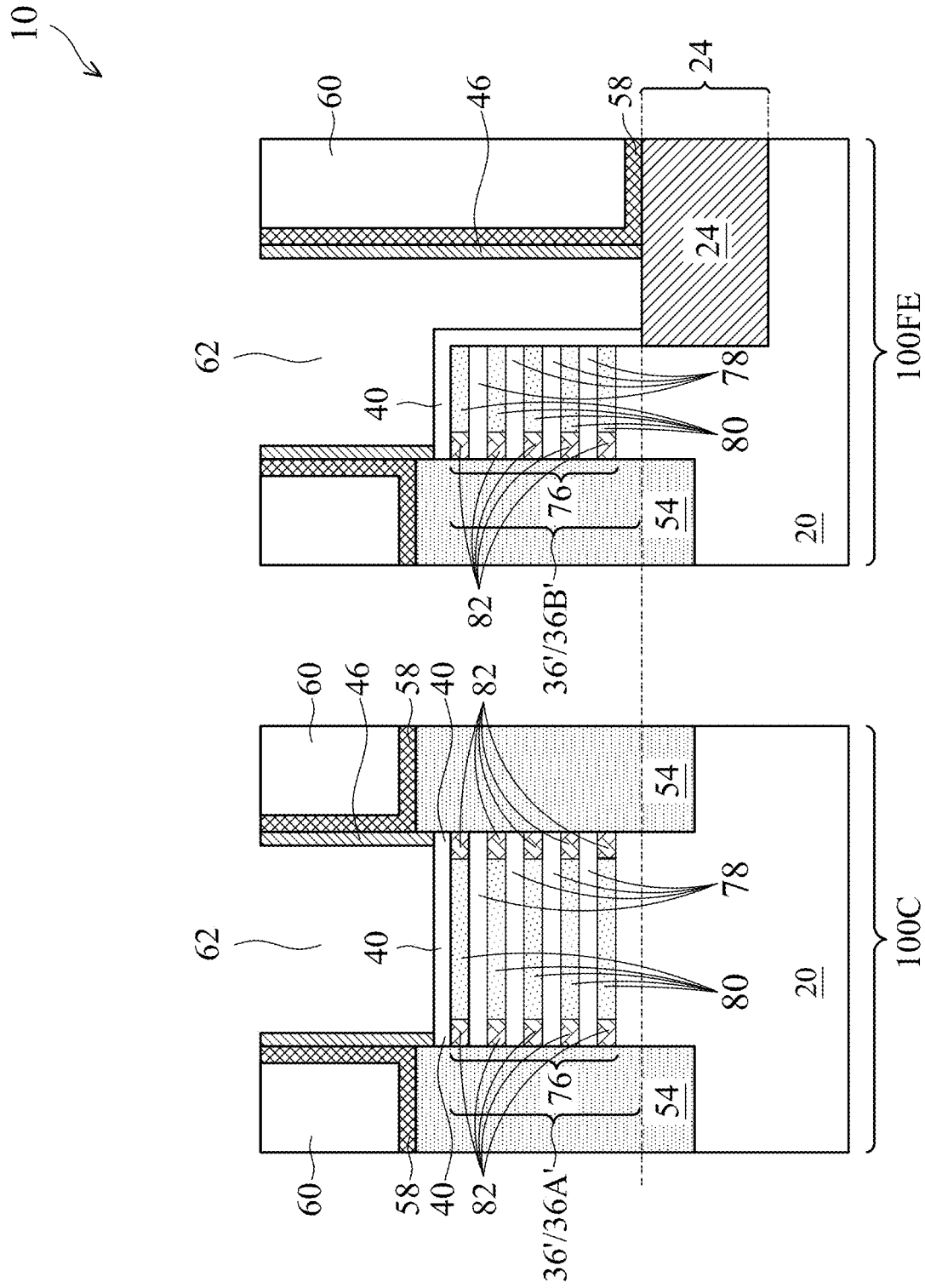
Figure 18:
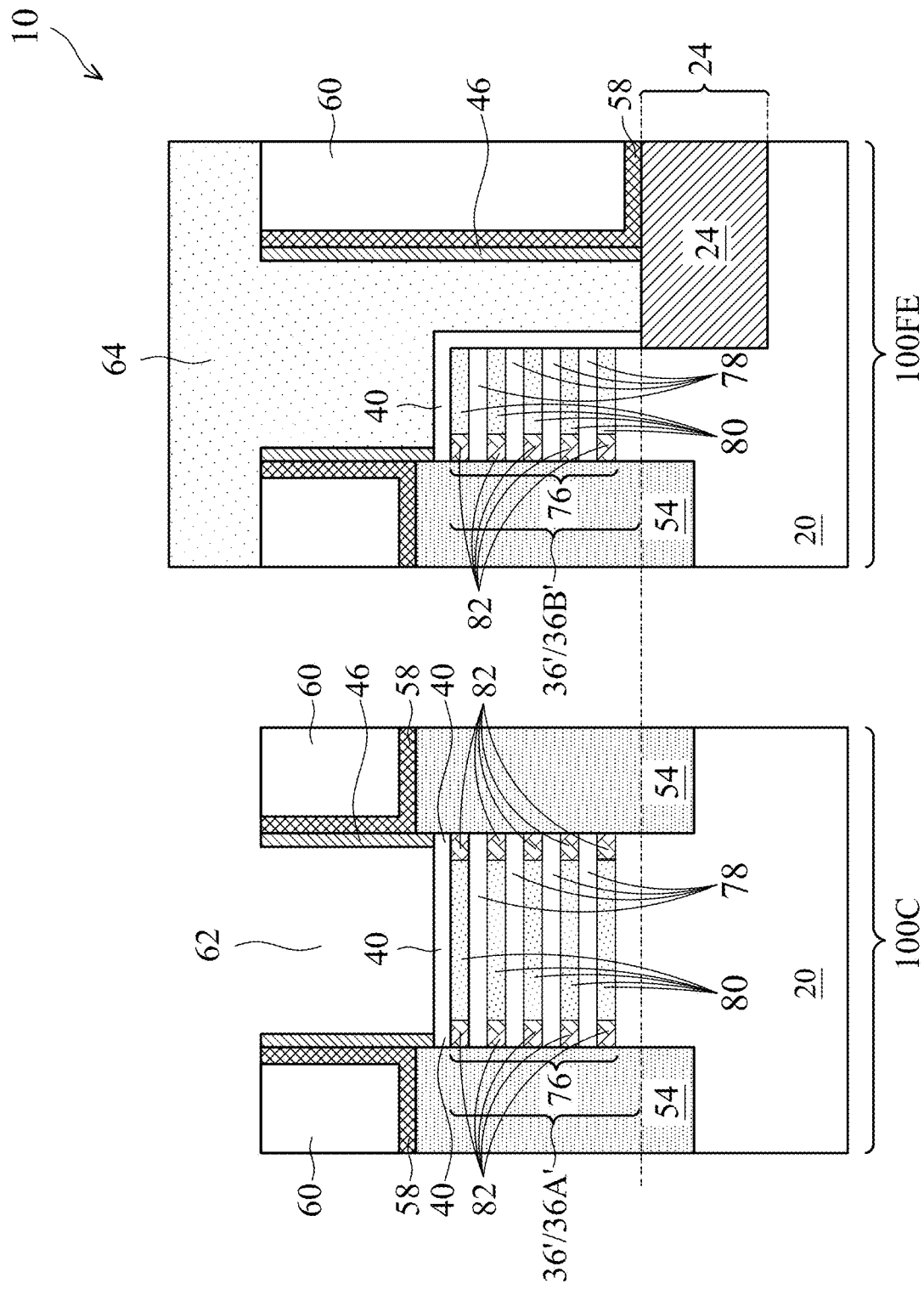

Next, hard masks 44 and dummy gate electrodes 42 are removed to form trenches 62, and the resulting structure is shown in FIG. 17. Gate dielectrics 40 are exposed simultaneously in device regions 100C and 100FE. Referring to FIG. 18, patterned etching mask 64 is formed to fill the trench 62 in device region 100FE, while the etching mask 64 is removed from device region 100C.

Figure 19:
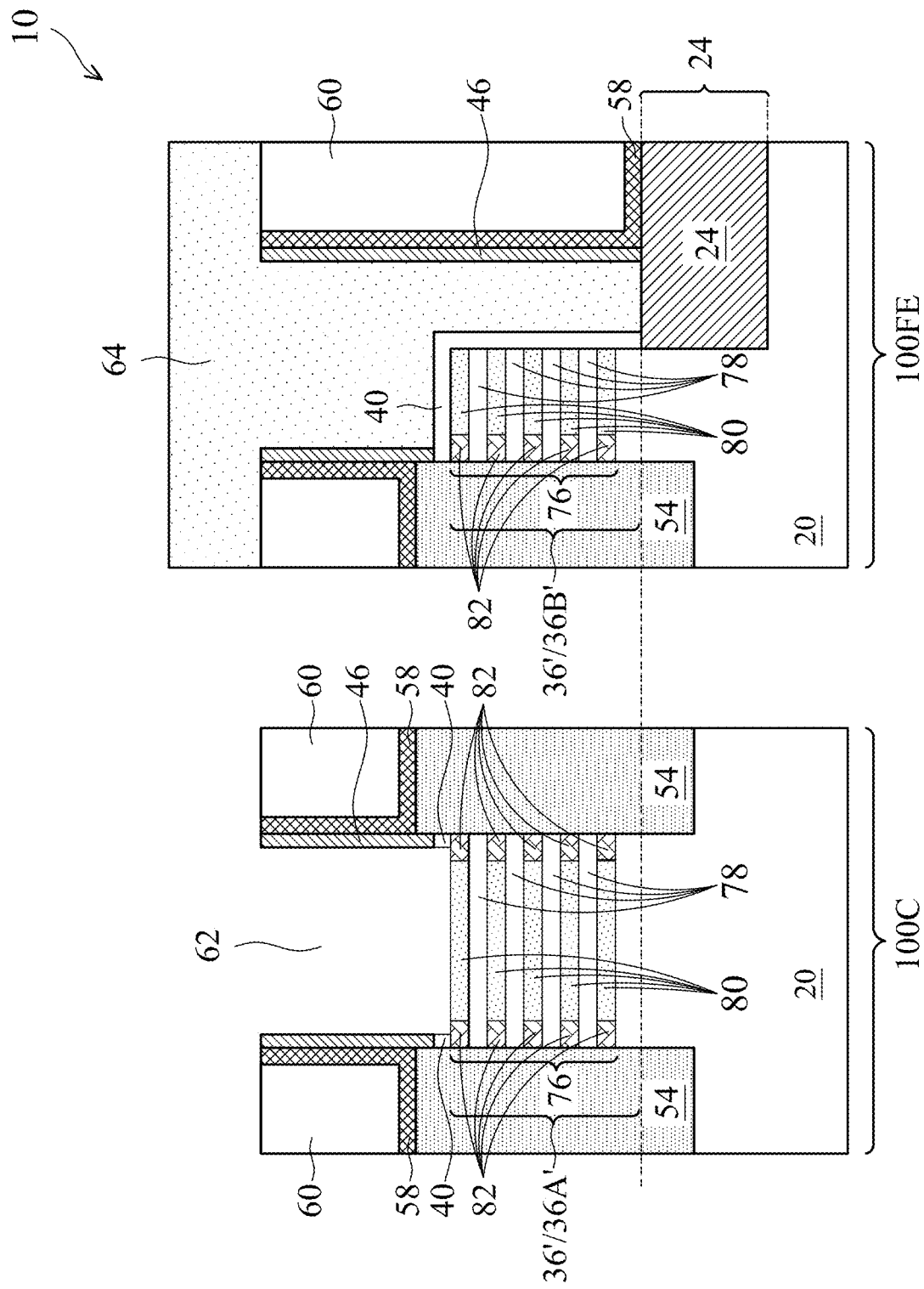
Figure 20:
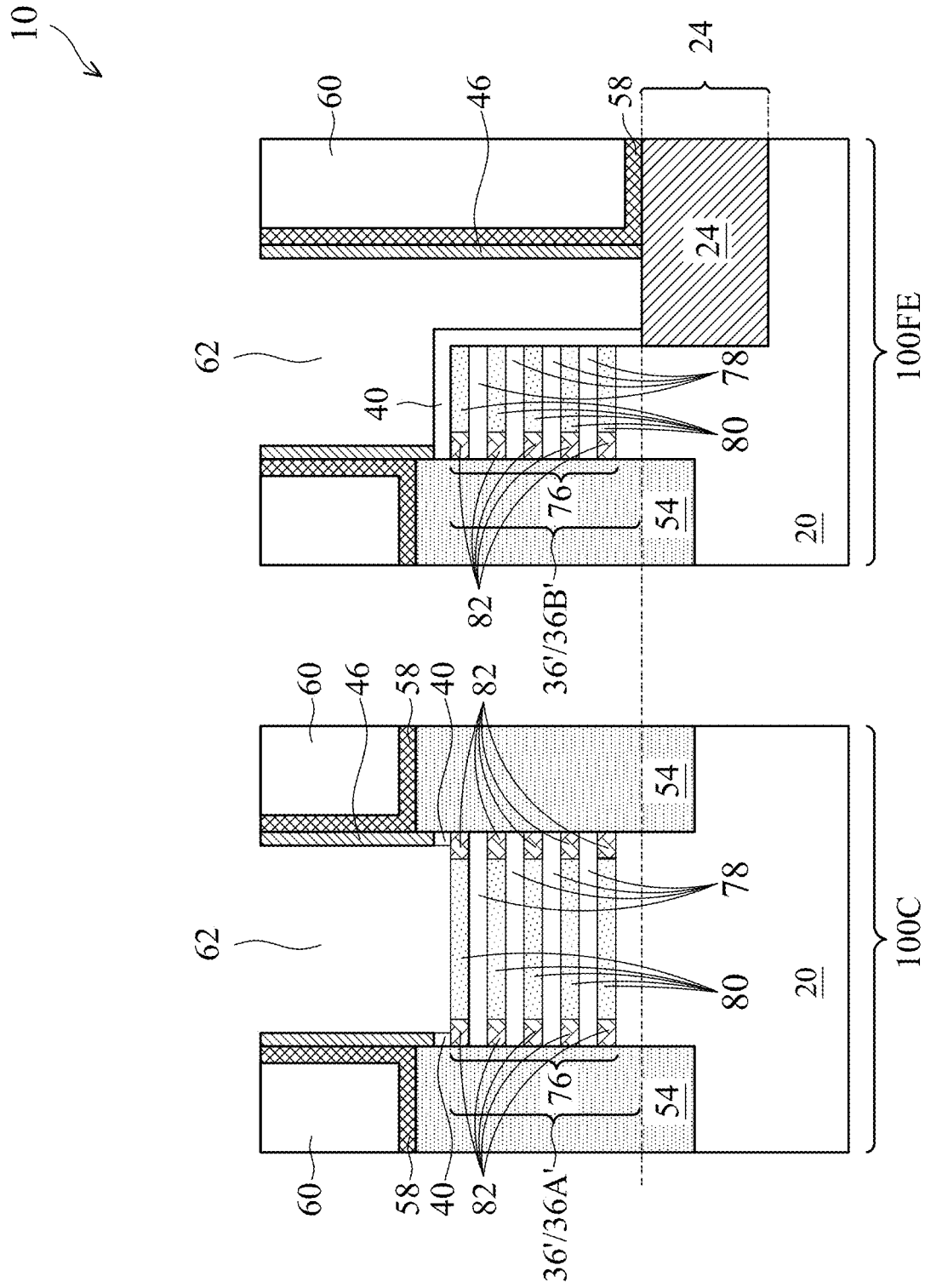
Figure 21:
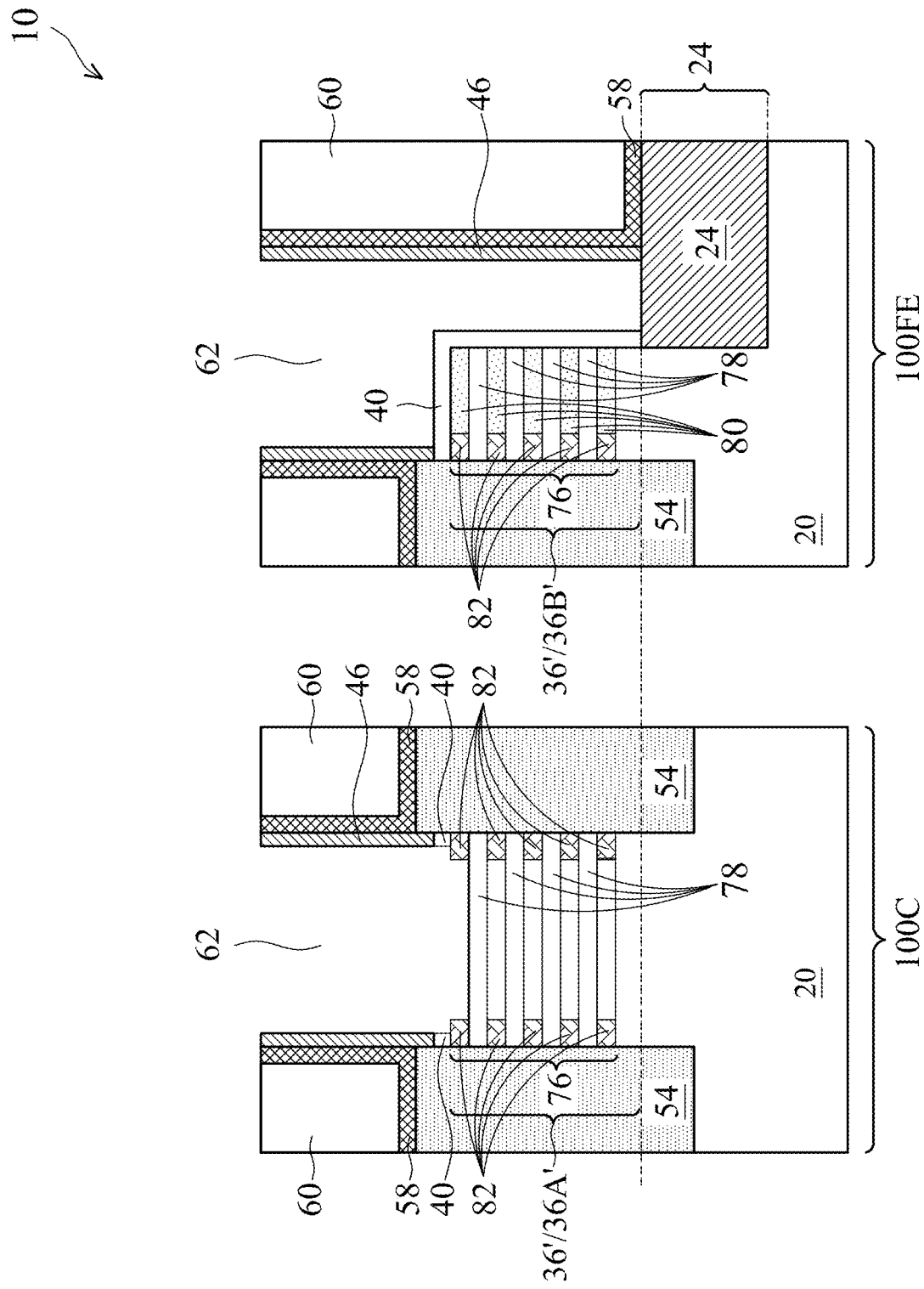

Next, dummy gate dielectric layer 40 is removed from device region 100C, while the gate dielectric layer 40 in device region 100FE is protected from the removal. The resulting structure is shown in FIG. 19. The etching mask 64 is then removed, and the resulting structure is shown in FIG. 20. In subsequent processes, sacrificial films 80 are removed from intermediate fin portion 36A', and the resulting structure is shown in FIG. 21. In accordance with some embodiments, inner spacers 82 are not removed, and will remain in the final GAA transistor. Inner spacers 82 may protect the source/drain regions 54 from being damaged when sacrificial films 80 are removed, and may isolate the subsequently formed gate stacks from being shorted to source/drain regions 54. As a result of the removal of sacrificial films 80, spaces are formed between channel layers 78.

In the removal of sacrificial films 80, the remaining dielectric layer 40 in trench 62 protects the corresponding fin-end portions 36B' of protruding fins from being removed. Accordingly, the fin-end portions 36B' of protruding fin 36' remain unremoved in the final structure. Furthermore, when sacrificial films 80 are removed from intermediate fin portions 36A', sacrificial films 80 in end portions 36B' are protected from being removed, and will remain in the final structure.

In subsequent processes, replacement gate stacks 72A and 72B are formed. GAA transistor 86 is thus formed. During the formation, dielectric layer 66 is first formed to encircle channel layers 78, which may include native oxide, and possibly the oxide layer formed through chemical oxidation or thermal oxidation of the surface portions of channel layers 78. Gate stack 72A includes dielectric layer 66, high-k dielectric layer 67A, and gate electrode 70A. High-k dielectric layer 67A and gate electrode 70A may extend into the spaces between neighboring channel layers 78. Fin-end gate structure 72B includes dielectric layer 40, high-k dielectric layer 67B, and gate electrode 70B.

Figure 22A:
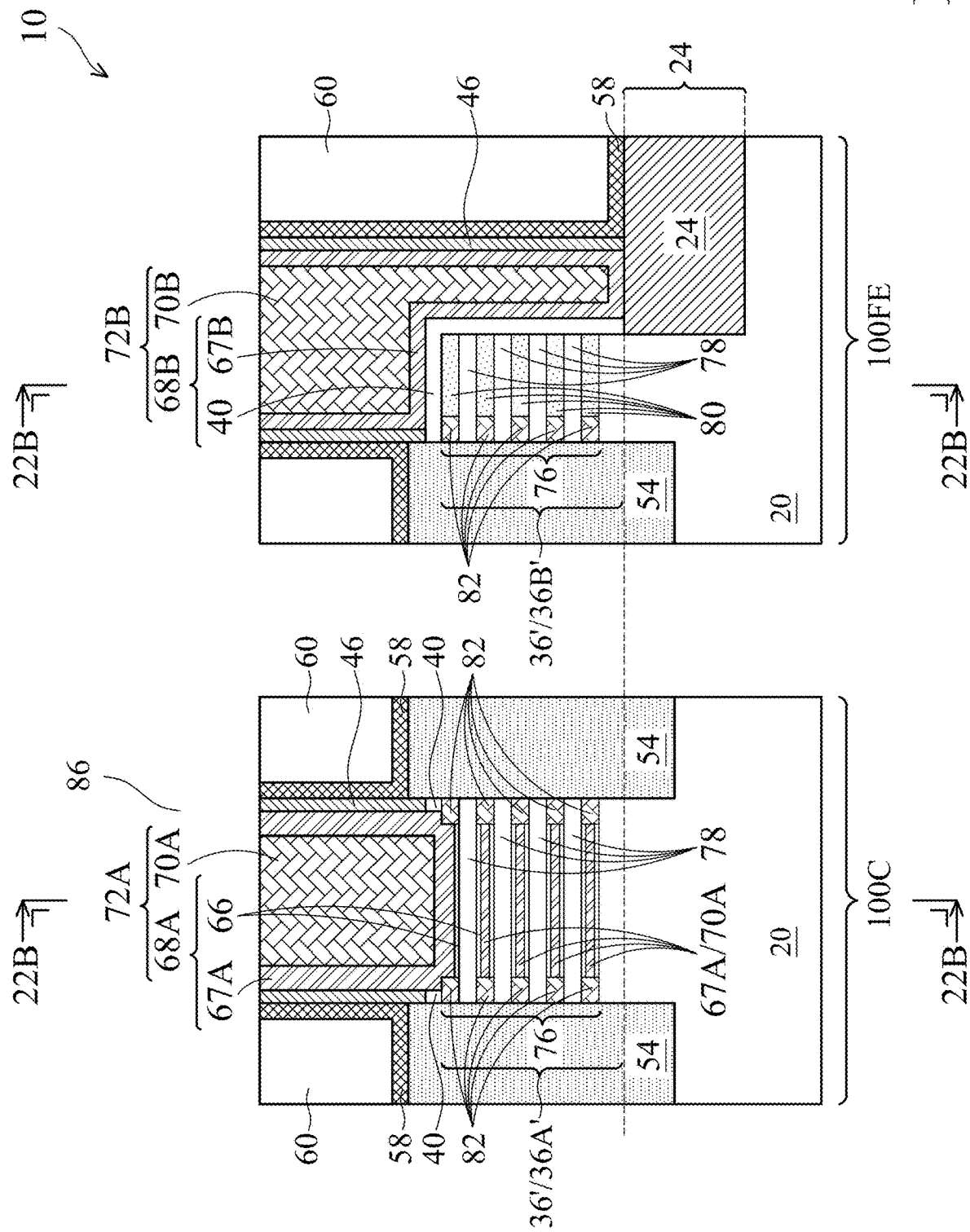
Figure 22B:
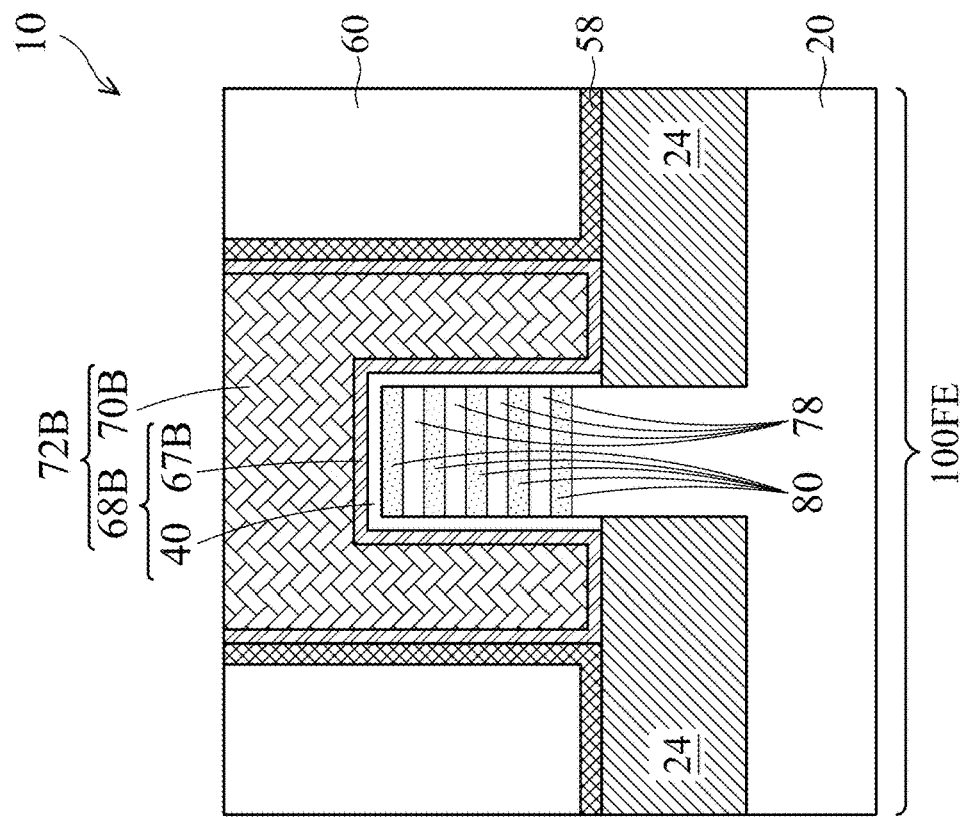
Figure 22B:
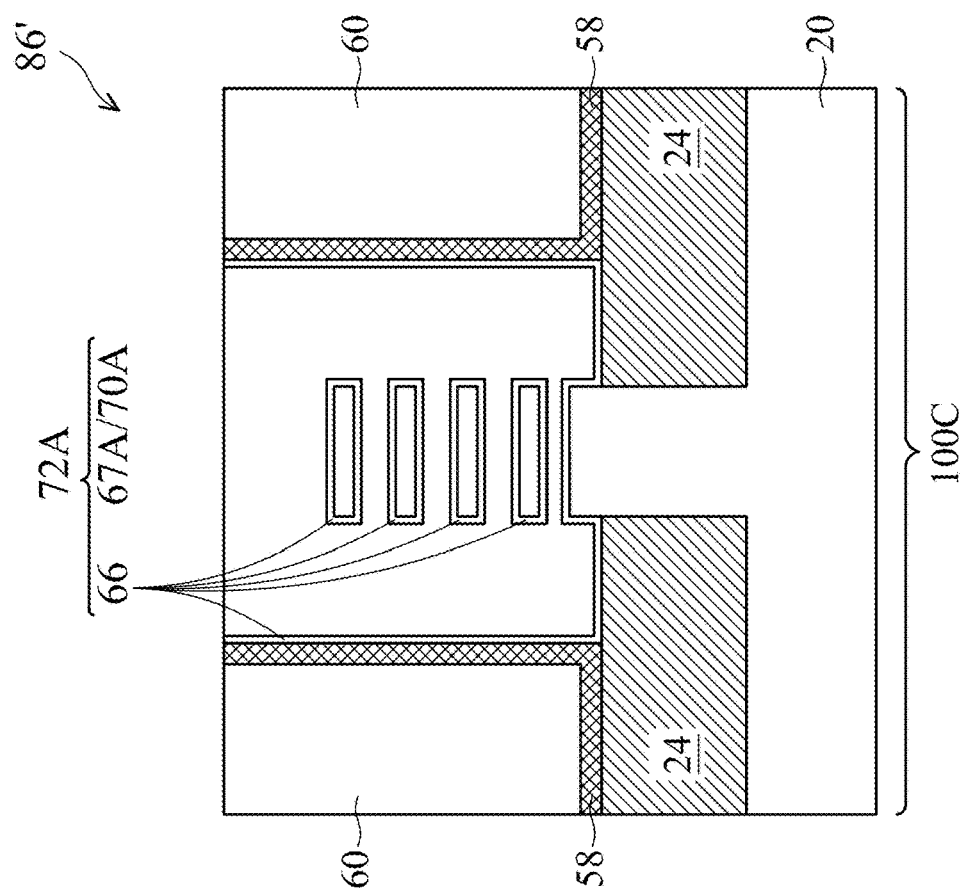

FIG. 22B illustrates reference cross-sections obtained from the reference cross-sections 22B-22B shown in FIG. 22A, and the reference cross-section shows the channel and gate portion of the GAA transistor 86. Also, the structure in device region 100IO is also illustrated.

The embodiments of the present disclosure have some advantageous features. The dielectric layers formed on the fin-end portions of the protruding fins is protected from being removed when dummy gate dielectric is removed from some device regions (such as core device regions). The remaining dielectric layers on the fin-end portions of the protruding fins protect the end portions of the protruding fins from being damaged, and the end portions of the protruding fins may further protect the neighboring source/drain regions.

In accordance with some embodiments of the present disclosure, a method includes depositing stacked layers on a first protruding fin; patterning the stacked layers to form a first gate stack comprising a first gate dielectric on an intermediate portion of the first protruding fin; and a first gate electrode on the first gate dielectric; and a second gate stack comprising a second gate dielectric on an end portion of the first protruding fin; and a second gate electrode on the second gate dielectric; removing the first gate electrode and the second gate electrode to reveal the first gate dielectric and the second gate dielectric, respectively; removing the first gate dielectric, wherein the second gate dielectric remains after the first gate dielectric is removed; forming a replacement gate dielectric on the intermediate portion of the first protruding fin; and forming a first replacement gate electrode and a second replacement gate electrode on the replacement gate dielectric and the second gate dielectric, respectively. In an embodiment, the replacement gate dielectric is formed to have a smaller thickness than the first gate dielectric. In an embodiment, the removing the first gate dielectric comprises forming an etching mask to cover the second gate dielectric, wherein the etching mask protects the second gate dielectric when the first gate dielectric is removed; and removing the etching mask. In an embodiment, the method further comprises, when the first gate stack is formed, forming a third gate stack comprising a third gate dielectric on an additional intermediate portion of a second protruding fin; and a third gate electrode on the third gate dielectric; removing the third gate electrode to reveal the third gate dielectric, wherein the third gate dielectric remains after the first gate dielectric is removed; and forming a third replacement gate electrode on the third gate dielectric. In an embodiment, the method further comprises, before the stacked layers are formed, forming isolation regions extending into a semiconductor substrate; and forming the first protruding fin protruding higher than the isolation regions, wherein the isolation regions comprise portions on opposing sides of the first protruding fin. In an embodiment, an entirety of the first protruding fin is semiconductor. In an embodiment, the first protruding fin comprises a plurality of channel layers; and a plurality of sacrificial films, wherein the plurality of channel layers and the plurality of sacrificial films are allocated alternatingly to form an additional stack of layers. In an embodiment, the method further comprises removing the plurality of sacrificial films from the intermediate portion of the first protruding fin. In an embodiment, when the plurality of sacrificial films are removed from the intermediate portion of the first protruding fin, the plurality of sacrificial films in the end portion of the first protruding fin are protected by the second gate dielectric from being removed.

In accordance with some embodiments of the present disclosure, a method comprises simultaneously forming a first dummy gate stack and a second dummy gate stack on a first portion and a second portion of a protruding fin; simultaneously removing a first gate electrode of the first dummy gate stack and a second gate electrode of the second dummy gate stack to form a first trench and a second trench, respectively; forming an etching mask, wherein the etching mask fills the first trench and the second trench; patterning the etching mask to remove the etching mask from the first trench; removing a first dummy gate dielectric of the first dummy gate stack, wherein the etching mask protects a second dummy gate dielectric of the second dummy gate stack from being removed; and forming a first replacement gate stack and a second replacement gate stack in the first trench and the second trench, respectively. In an embodiment, the second dummy gate stack extends on a first sidewall surface, a second sidewall surface, and a third sidewall surface of the protruding fin, wherein the first sidewall surface and the second sidewall surface are along a lengthwise direction of the protruding fin, and the third sidewall surface is along a widthwise direction of the protruding fin. In an embodiment, the first dummy gate dielectric comprises a first silicon oxide layer having a first thickness, and the forming the first replacement gate stack comprises forming a second silicon oxide layer having a second thickness smaller than the first thickness. In an embodiment, the method further comprises forming a source region and a drain region on opposing sides of the first dummy gate stack; and forming an additional source/drain region on a side of the second dummy gate stack, wherein the protruding fin ends at a position directly underlying the second dummy gate stack. In an embodiment, the forming the etching mask comprises dispensing a photo resist.

In accordance with some embodiments of the present disclosure, a structure comprises isolation regions extending into a semiconductor substrate; a protruding fin between portions of the isolation regions, wherein the protruding fin protrudes higher than the isolation regions; a first gate stack comprising a first gate dielectric on first sidewalls and a first top surface of a first portion of the protruding fin, wherein the first gate dielectric has a first thickness; and a first gate electrode on the first gate dielectric; and a second gate stack comprising a second gate dielectric on second sidewalls and a second top surface of a second portion of the protruding fin, wherein the protruding fin ends directly underlying the second gate stack, and the second gate dielectric has a second thickness greater than the first thickness; and a second gate electrode on the second gate dielectric. In an embodiment, the first gate dielectric comprises a first oxide layer and a first high-k dielectric layer over the first oxide layer, and the second gate dielectric comprises a second oxide layer and a second high-k dielectric layer over the second oxide layer, and the second oxide layer is thicker than the first oxide layer. In an embodiment, the first high-k dielectric layer and the second high-k dielectric layer are formed of same materials. In an embodiment, a ratio of the second thickness to the first thickness is in a range between about 4 and about 6. In an embodiment, the structure further comprises a source region and a drain region on opposing sides of the first gate stack; and an additional source/drain region on a side of the second gate stack. In an embodiment, the second gate dielectric further extends on an additional sidewall of the second portion of the protruding fin, and the additional sidewall extends in a direction perpendicular to a lengthwise direction of the protruding fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   isolation regions extending into a semiconductor substrate;
   a protruding fin between portions of the isolation regions, wherein the protruding fin protrudes higher than the isolation regions;
   a first gate stack comprising:
      a first gate dielectric on first sidewalls and a first top surface of a first portion of the protruding fin, wherein the first gate dielectric has a first thickness; and
      a first gate electrode on the first gate dielectric; and
   a second gate stack comprising:
      a second gate dielectric on second sidewalls and a second top surface of a second portion of the protruding fin, wherein in a top view of the structure, the protruding fin ends directly underlying the second gate stack, with an end of the protruding fin being laterally between, and parallel to, opposing sidewalls of the second gate stack in the top view, and the second gate dielectric has a second thickness greater than the first thickness; and
      a second gate electrode on the second gate dielectric.

2. The structure of claim 1, wherein the first gate dielectric comprises a first oxide layer and a first high-k dielectric layer over the first oxide layer, and the second gate dielectric comprises a second oxide layer and a second high-k dielectric layer over the second oxide layer, and the second oxide layer is thicker than the first oxide layer.

3. The structure of claim 2, wherein the first high-k dielectric layer and the second high-k dielectric layer are formed of same materials.

4. The structure of claim 2, wherein a ratio of a third thickness of the second oxide layer to a fourth thickness of the first oxide layer is in a range between about 4 and about 6.

5. The structure of claim 2, wherein the first high-k dielectric layer and the second high-k dielectric layer have a same thickness.

6. The structure of claim 1 further comprising:
   a first gate spacer on a sidewall of the first gate stack; and
   a second gate spacer on a sidewall of the second gate stack, wherein the first gate spacer is thinner than the second gate spacer.

7. The structure of claim 1, wherein the second gate dielectric further extends on an additional sidewall of the second portion of the protruding fin, and the additional sidewall extends in a direction perpendicular to a lengthwise direction of the protruding fin.

8. The structure of claim 1, wherein the protruding fin is directly underlying a first edge of the second gate stack, and is spaced apart from a second edge of the second gate stack, and wherein the first edge and the second edge are opposite edges of the second gate stack that are parallel to each other.

9. A structure comprising:
a semiconductor substrate;
a protruding fin higher than the semiconductor substrate;
a first gate stack comprising:
  a first gate dielectric on first two sidewalls and a first top surface of a first portion of the protruding fin, wherein the first gate dielectric has a first thickness; and
  a first gate electrode on the first gate dielectric; and
a second gate stack comprising:
  a second gate dielectric on three sidewalls and a second top surface of a second portion of the protruding fin, wherein the three sidewalls are perpendicular to a major top surface of the semiconductor substrate, and the second top surface is substantially parallel to the major top surface; and
  a second gate electrode on the second gate dielectric.

10. The structure of claim 9, wherein the three sidewalls of the second gate dielectric comprises:
second two sidewalls parallel to each other; and
a third sidewall interconnecting the second two sidewalls.

11. The structure of claim 9, wherein the three sidewalls are perpendicular to a major bottom surface of the semiconductor substrate.

12. The structure of claim 9, wherein the first gate dielectric comprises a first high-k dielectric layer, and the second gate dielectric comprises a second high-k dielectric layer, and wherein the first high-k dielectric layer and the second high-k dielectric layer are formed of a same high-k dielectric material.

13. The structure of claim 9, wherein the protruding fin has a fin end, and the fin end is laterally between a first sidewall and a second sidewall of the second gate stack.

14. The structure of claim 9 further comprising:
a first gate spacer on a sidewall of the first gate stack; and
a second gate spacer on a sidewall of the second gate stack, wherein the first gate spacer is thinner than the second gate spacer.

15. The structure of claim 9 further comprising shallow trench isolation regions extending into the semiconductor substrate, wherein both of the first gate dielectric and the second gate dielectric have bottom ends contacting top surfaces of the shallow trench isolation regions.

16. The structure of claim 9, wherein the second gate dielectric is thicker than the first gate dielectric.

17. A structure comprising:
a protruding fin comprising a first portion and a second portion;
a source/drain region between the first portion and the second portion, wherein edges of the source/drain region are physically joined to both of the first portion and the second portion, and the source/drain region continuously extends from the first portion to the second portion of the protruding fin, wherein the first portion, the second portion, and the source/drain region are aligned to a straight line;
a first gate oxide layer on the first portion, wherein the first gate oxide layer has a first thickness;
a first gate electrode over the first gate oxide layer;
a second gate oxide layer on the second portion, wherein the second gate oxide layer has a second thickness smaller than the first thickness; and
a second gate electrode over the second gate oxide layer.

18. The structure of claim 17 further comprising:
a first high-k dielectric layer over the first gate oxide layer and underlying the first gate electrode; and
a second high-k dielectric layer over the second gate oxide layer and underlying the second gate electrode, wherein the first high-k dielectric layer and the second high-k dielectric layer comprise a same high-k dielectric material.

19. The structure of claim 17 further comprising a first gate spacer and a second gate spacer on opposite sidewalls of the first gate electrode, wherein the first gate spacer overlaps the first portion of the protruding fin, and wherein the second gate spacer is vertically offset from the first portion of the protruding fin.

20. The structure of claim 19 further comprising a third gate spacer and a fourth gate spacer on opposite sidewalls of the second gate electrode, wherein both of the third gate spacer and the fourth gate spacer overlap the second portion of the protruding fin.

* * * * *